United States Patent
Park

(10) Patent No.: US 11,877,465 B2
(45) Date of Patent: Jan. 16, 2024

(54) DISPLAY DEVICE AND REPAIRING METHOD THEREOF

(71) Applicant: LG Display Co., Ltd., Seoul (KR)

(72) Inventor: Sunghee Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 22 days.

(21) Appl. No.: 17/370,850

(22) Filed: Jul. 8, 2021

(65) Prior Publication Data
US 2022/0020947 A1    Jan. 20, 2022

(30) Foreign Application Priority Data

Jul. 20, 2020   (KR) .......................... 10-2020-0089745

(51) Int. Cl.
*G09G 3/3233* (2016.01)
*H10K 50/813* (2023.01)

(52) U.S. Cl.
CPC ......... *H10K 50/813* (2023.02); *G09G 3/3233* (2013.01); *G09G 2300/0426* (2013.01); *G09G 2330/08* (2013.01); *G09G 2330/10* (2013.01)

(58) Field of Classification Search
CPC ............ H01L 51/5206; H01L 51/5209; G09G 3/3233; G09G 2300/0426; G09G 2330/08; G09G 2330/10; G09G 2330/12
See application file for complete search history.

(56) References Cited

U.S. PATENT DOCUMENTS

2020/0066817 A1* 2/2020 Kim ................... H01L 51/5221
2020/0313102 A1* 10/2020 Kim ..................... H10K 59/124

* cited by examiner

*Primary Examiner* — Dennis P Joseph
(74) *Attorney, Agent, or Firm* — Seed IP Law Group LLP

(57) ABSTRACT

Disclosed is a display device. The display device includes: a substrate on which a sub-pixel including a transmissive part and a light emitting part is disposed; a transistor disposed on the substrate; and an organic light emitting diode connected to the transistor. The transmissive part includes a repair part in which an anode electrode of the organic light emitting diode is connected through a contact hole to an extension line extending from an electrode of the transistor.

22 Claims, 17 Drawing Sheets

DISPLAY DEVICE AND REPAIRING METHOD THEREOF

BACKGROUND

Technical Field

The present disclosure relates to a display device and more particularly to a display device capable of improving an aperture ratio and performing pixel repair and a repairing method thereof.

Description of the Related Art

With the development of the information-oriented society, a demand for a display device for displaying images is increasing in various forms. The display device has rapidly changed to a flat panel display (FPD) device which replaces a bulky cathode ray tube (CRT), is thin and light, and can have a large area. The FPD device includes a liquid crystal display (LCD) device, a plasma display panel (PDP), an organic light emitting display (OLED) device, and electrophoretic display (ED) device, etc.

Among them, the OLED device is a self-luminous element that emits light by itself, has a rapid response speed, and has great advantages in light emission efficiency, luminance, and viewing angle. Particularly, the OLED device can be formed even on a flexible substrate, can be driven at a voltage lower than that of the plasma display panel or an inorganic electroluminescence display, has relatively low power consumption, and has an excellent color sense.

Recently, a transparent display device is now being developed, which can be seen from the front side through the back side thereof. For example, the transparent organic light emitting display device composed of a light emitting part where each pixel area emits light and a transmissive part which transmits external light therethrough implements the transparent display device.

BRIEF SUMMARY

The inventors of the present disclosure have appreciated that since the pixel area has a trade-off relation, when the light emitting part becomes larger, the transmissive part becomes smaller and when the transmissive part becomes larger, the light emitting part becomes smaller. Accordingly, it is difficult to increase the aperture ratio of the light emitting part. Therefore, the inventors have provided one or more embodiments that can increase the aperture ratio of the light emitting part without reducing the transmissive part in the transparent display device. Further, technical improvement of the related art is provided by one or more embodiments of the present disclosure.

In particular, the present disclosure provides a display device capable of preventing maximally the loss of a transmissive part and performing pixel repair, and a repairing method thereof.

A display device according to one embodiment may include a substrate on which a sub-pixels including a transmissive part and a light emitting part is disposed; a transistor disposed on the substrate; and an organic light emitting diode connected to the transistor. The transmissive part may include a repair part in which an anode electrode of the organic light emitting diode is connected through a contact hole to an extension line extending from an electrode of the transistor.

The anode electrode may include a first anode electrode disposed on a first light emitting part and having a first extension part extending to the repair part; and a second anode electrode disposed on a second light emitting part and having a second extension part extending to the repair part. The first extension part may be connected to the extension line through a first contact hole, and the second extension part may be connected to the extension line through a second contact hole.

When the second light emitting part is defective, the second anode electrode may be cut within the second contact hole or in the second extension part to be separated from the extension line.

The anode electrode may include the first anode electrode disposed in the first light emitting part and second anode electrode disposed in the second light emitting part. The first anode electrode and the second anode electrode may be extended to the repair part and be connected to each other within the repair part.

The extension line may include an exposed part formed adjacent to one side of the anode electrode within the repair part and does not overlap with the anode electrode.

The display device may further include a partition wall formed on the one side of the anode electrode adjacent to the exposed part and having an inverted tapered side surface; a light emitting layer of the organic light emitting diode covering the anode electrode and the partition wall; and a cathode electrode which is formed on the light emitting layer.

The one side of the anode electrode may not be covered by the light emitting layer and the cathode electrode around the partition wall.

A passivation layer and an overcoat layer may be interposed between the one side of the anode electrode and the extension line.

Only a passivation layer may be interposed between the one side of the anode electrode and the extension line.

The exposed part may a part protruding from one side of the extension line overlapping with the first anode electrode to the outside of the first anode electrode.

When the first or the second light emitting part is defective, the exposed part may be connected to the one side of the first anode electrode.

The display device may further include a passivation layer covering the extension line within the repair part; and an overcoat layer formed on the passivation layer and having an opening exposing a region of the passivation layer. The first anode electrode may be disposed on the overcoat layer such that at least one region thereof overlaps with the opening and the extension line.

When the first or the second light emitting part is defective, the passivation layer may be removed within the opening and the extension line and the first anode electrode may be connected to each other.

A repair method of the display device according to an embodiment may include, when the second light emitting part is defective, a cutting step of disconnecting the connection between the second anode electrode and the extension line within the repair part; and a welding step of connecting the first anode electrode and the extension line within the repair part.

The cutting step may include a step of irradiating a laser beam to into the second contact hole or to the second extension part.

The welding step may include a step of irradiating a laser beam to the exposed part.

The welding step may include a step of irradiating a laser beam to the first anode electrode within the opening.

The passivation layer may be removed by the laser beam and the first anode electrode may be connected to the extension line.

The organic light display device according to embodiments of the present disclosure has a first repair part and a second repair part, so that a repair of the organic light display device may be performed when a malfunction or defect of a sub-pixel is detected.

Also, the organic light display device according to embodiments of the present disclosure improves an aperture ratio by forming a contact part between a first electrode and a driving transistor through an extension line extending from one electrode of the driving transistor (e. g, a source electrode), which is an upper electrode of capacitor.

In the organic light display device according to embodiments of the present disclosure, an anode contact part of the organic light emitting diode is formed in a transmissive part not in a light emitting part, so that the aperture ratio can be improved.

DETAILED DESCRIPTION

Hereinafter, one or more embodiments of the present disclosure will be described with reference to the accompanying drawings. Throughout the disclosure, the same references mean substantially the same components. In the following description, the detailed description of known functions and configurations incorporated related to the present disclosure is omitted when it may make the subject matter of the present disclosure rather unclear. Also, the component names used in the following description may be selected in consideration of making it easier to write the specification and may be different from the component names of an actual product.

An organic light emitting display device, a liquid crystal display, an electrophoretic display, etc., can be used as the display device according to the embodiment of the present disclosure. In the present disclosure, the organic light emitting display device will be described as an example. The organic light emitting display device includes a light emitting layer composed of organic matters between a first electrode that is an anode and a second electrode that is a cathode. Therefore, electrons supplied from the first electrode and holes supplied from the second electrode are combined within the light emitting layer and then an exciton that is an electron-hole pair is formed. The organic light emitting display device is a self-light emitting display device which emits light by the energy generated as the exciton returns to the ground state.

Figure 1:
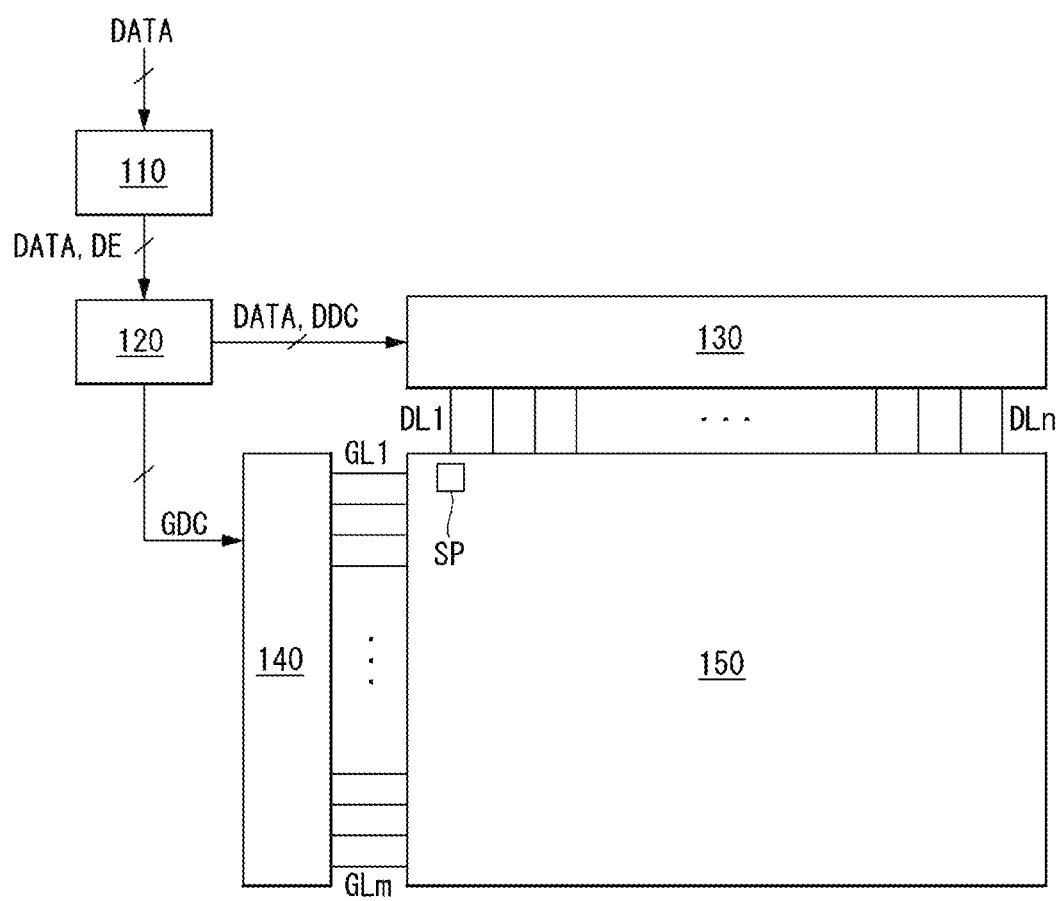
FIG. 1 is a schematic block diagram of an organic light emitting display device.

FIG. 1 is a schematic block diagram of the organic light emitting display device.

Referring to FIG. 1, the organic light emitting display device includes an image processing unit 110, a timing controller 120, a data driver 130, a scan driver 140, and a display panel 150.

The image processing unit 110 outputs a data enable signal DE and an image data DATA provided from the outside. The image data DATA may include a plurality of gradation data. In addition to the data enable signal DE, the image processing unit 110 may further output a horizontal synchronization signal, a vertical synchronization signal, and a clock signal, etc., as a control signal.

The timing controller 120 receives the image data DATA from the image processing unit 110. In addition, the timing controller 120 receives a control signal including the data enable signal DE from the image processing unit 110. The timing controller 120 processes the image data DATA and the control signal to suit the operating conditions of the display panel 150 and then outputs the image data DATA, a gate timing control signal GDC for controlling an operation timing of the scan driver 140, and a data timing control signal DDC for controlling an operation timing of the data driver 130.

The data driver 130 generates data signals from the image data DATA in response to the data timing control signal DDC provided from the timing controller 120. The data driver 130 may output the data signals generated through the data lines DL1 to DLn.

In various embodiments, the data driver 130 may be further connected to sub-pixels SP of the display panel 150 through a plurality of sensing lines (or reference lines). The data driver 130 may provide a reference voltage (or a sensing voltage, an initialization voltage) to the sub-pixels SP through the plurality of sensing lines, or may sense the state of the sub-pixels SP on the basis of an electrical signal fed back from the sub-pixels SP.

The scan driver 140 generates scan signals in response to the gate timing control signal GDC provided from the timing controller 120. The scan driver 140 outputs the scan signals through gate lines GL1 to GLm.

The display panel 150 displays an image in response to the data signal and the scan signal provided from the data driver 130 and the scan driver 140. The display panel 150 includes sub-pixels SP that operate to display an image. The sub-pixels SP may be, for example, arranged on the display panel 150 in the form of a matrix. The sub-pixels SP may have the same or different light emitting areas according to light emission characteristics.

Each sub-pixel SP may display any one of the first to third colors. In the embodiment, each sub-pixel SP may display any one of red, green, and blue colors. In another embodiment, each sub-pixel SP may display any one of cyan, magenta, and yellow colors.

Alternatively, each sub-pixel SP may display any one of the first to fourth colors. In the embodiment, each sub-pixel SP may display any one of red, green, blue, and white colors.

The timing controller 120, the data driver 130, and the scan driver 140 may each be composed of a separate integrated circuit (IC), or may be composed of an integrated circuit in which at least some of them are integrated. For example, the data driver 130 may be composed of an integrated circuit integrated with the timing controller 120.

In addition, in FIG. 1, the data driver 130 and the scan driver 140 are shown as separate components from the display panel 150. However, at least one of the data driver 130 and the scan driver 140 may be configured in an In-Panel method where it is formed integrally with the display panel 150. For example, the scan driver 140 may be integrally formed with the display panel 150 in accordance with a gate In-panel (GIP) method.

Figure 2:
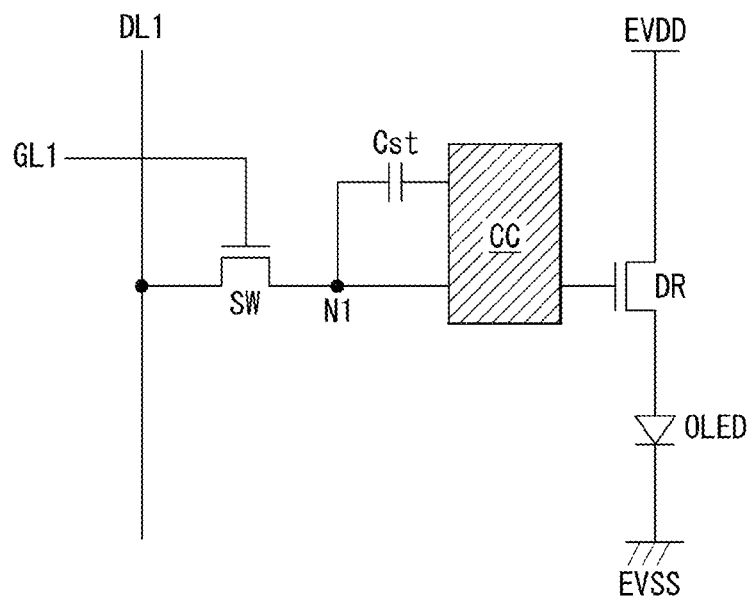
FIG. 2 is a schematic circuit diagram of a sub-pixel.
Figure 3:
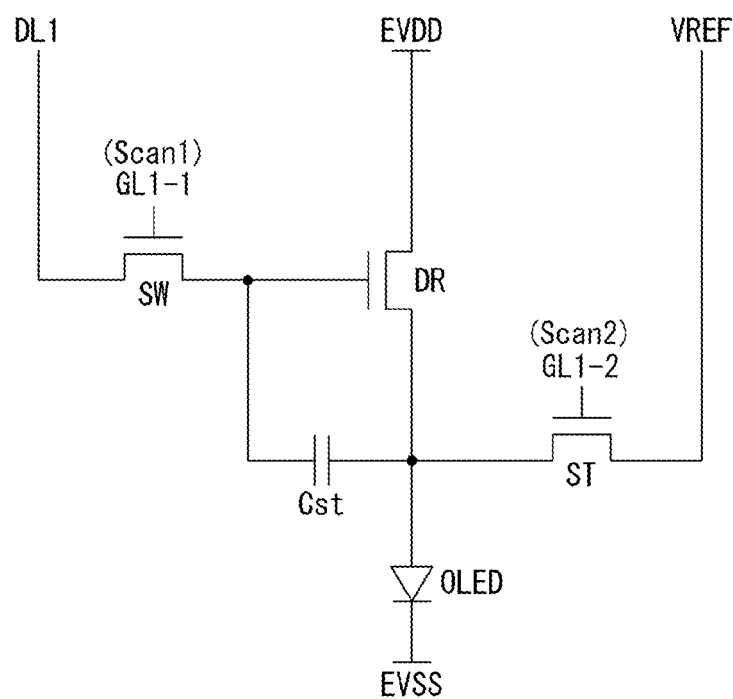
FIG. 3 is an example circuit diagram of the sub-pixel.

FIG. 2 is a schematic circuit diagram of a sub-pixel, and FIG. 3 is an example circuit diagram of the sub-pixel. In FIG. 2, the sub-pixel SP connected to the first gate line GL1 and the first data line DL1 is shown as an example.

Referring to FIG. 2, the sub-pixel SP may include a switching transistor SW, a driving transistor DR, a capacitor Cst, a compensation circuit CC, and an organic light emitting diode OLED.

A first electrode (e.g., a drain electrode) of the switching transistor SW is electrically connected to the data line DL1, and a second electrode (e.g., a source electrode) is electrically connected to a first node N1. A gate electrode of the switching transistor SW is electrically connected to the gate line GL1. The switching transistor SW transmits the data signal provided through the data line DL1 to the first node N1 in response to the scan signal provided through the gate line GL1.

The capacitor Cst is electrically connected to the first node N1 to charge the voltage applied to the first node N1.

A first electrode (e.g., a drain electrode) of the driving transistor DR receives with a high potential driving voltage EVDD, and a second electrode (e.g., a source electrode) is electrically connected to a first electrode (e.g., an anode electrode) of the organic light emitting diode OLED. The driving transistor DR may control an amount of a driving current flowing through the organic light emitting diode OLED in response to a voltage applied to the gate electrode.

The organic light emitting diode (OLED) outputs light corresponding to the driving current. The organic light emitting diode OLED may output light corresponding to any one of red, green, and blue colors.

The compensation circuit CC may be provided within the sub-pixel SP in order to compensate for a threshold voltage, etc., of the driving transistor DR. The compensation circuit CC may be composed of one or more transistors. The compensation circuit CC may be variously configured according to the compensation method of the sub-pixel SP.

Referring to FIG. 3, in the embodiment, a sensing transistor ST may be included in the compensation circuit CC.

In this embodiment, the first electrode of the switching transistor SW is electrically connected to the data line DL1, and the second electrode is electrically connected to the gate electrode of the driving transistor DR. The gate electrode of the switching transistor SW is electrically connected to the first-1th gate line GL1-1.

A first electrode of the capacitor Cst is electrically connected to the gate electrode of the driving transistor DR, and a second electrode is electrically connected to the first electrode of the organic light emitting diode OLED.

The first electrode of the driving transistor DR receives the high potential driving voltage EVDD, and the second electrode is electrically connected to the first electrode (e.g., an anode electrode) of the organic light emitting diode OLED. The gate electrode of the driving transistor DR is electrically connected to the second electrode of the switching transistor SW.

A first electrode (e.g., a drain electrode) of the sensing transistor ST receives a reference voltage (or a sensing voltage, VREF), and a second electrode (e.g., a source electrode) is electrically connected to the second electrode of the driving transistor DR. A gate electrode of the sensing transistor ST is connected to the first-2th gate line GL1-2. In response to the scan signal applied to the first-2th gate line GL1-2, the sensing transistor ST may supply the sensing voltage VREF to the driving transistor DR or may transmit a voltage or a current which includes electrical characteristics of the driving transistor DR to the data driver 130.

The operation time of the sensing transistor ST may be similar to, the same as, or different from that of the switching transistor SW in accordance with a compensation algorithm (or a configuration of the compensation circuit). In the illustrated embodiment, a first scan signal Scan1 may be applied to the first-1th gate line GL1-1, and a second scan signal Scan2 may be applied to the first-2th gate line GL1-2. In another embodiment, the gate electrode of the switching transistor SW and the gate electrode of the sensing transistor ST may be connected to one gate line in common.

The data driver 130 may sense a characteristic of the sub-pixel SP on the basis of a voltage or current transmitted through the sensing transistor ST. The data driver 130 may perform sensing in real time during a non-display period of an image or during N frames (N is an integer greater than or equal to 1). In the embodiment, when the switching transistor SW and the sensing transistor ST are turned on at the same time, the data driver 130 may separate (divide) the sensing operation and the output operation of the data signal from each other in a time-division manner.

A compensation target according to the sensing result may include a data signal in digital form, a data signal in analog form, and gamma, etc. The compensation circuit for generating a compensation signal (or compensation voltage) based on the sensing result may be implemented inside the data driver 130, inside the timing controller 120, or as a separate circuit.

In FIG. 3, a 3T (Transistor) 1C (Capacitor) structure in which the sub-pixel SP includes the switching transistor SW, the driving transistor DR, the capacitor Cst, the organic light emitting diode OLED, and a sensing transistor ST has been described as an example. However, the technical spirit of the present disclosure is not limited thereto, and the sub-pixel SP may have various structures such as 3T2C, 4T2C, 5T1C, 6T2C, etc.

In addition, although an example in which the transistors are NMOS transistors is shown in FIGS. 2 and 3, the present embodiment is not limited thereto. For example, some or all of the transistors constituting each sub-pixel SP may be formed of a PMOS transistor. In various embodiments, some or all of the transistors may be implemented with a low temperature polysilicon (LTPS) thin film transistor, an oxide thin film transistor, or a low temperature polycrystalline oxide (LTPO) thin film transistor.

Figure 4:
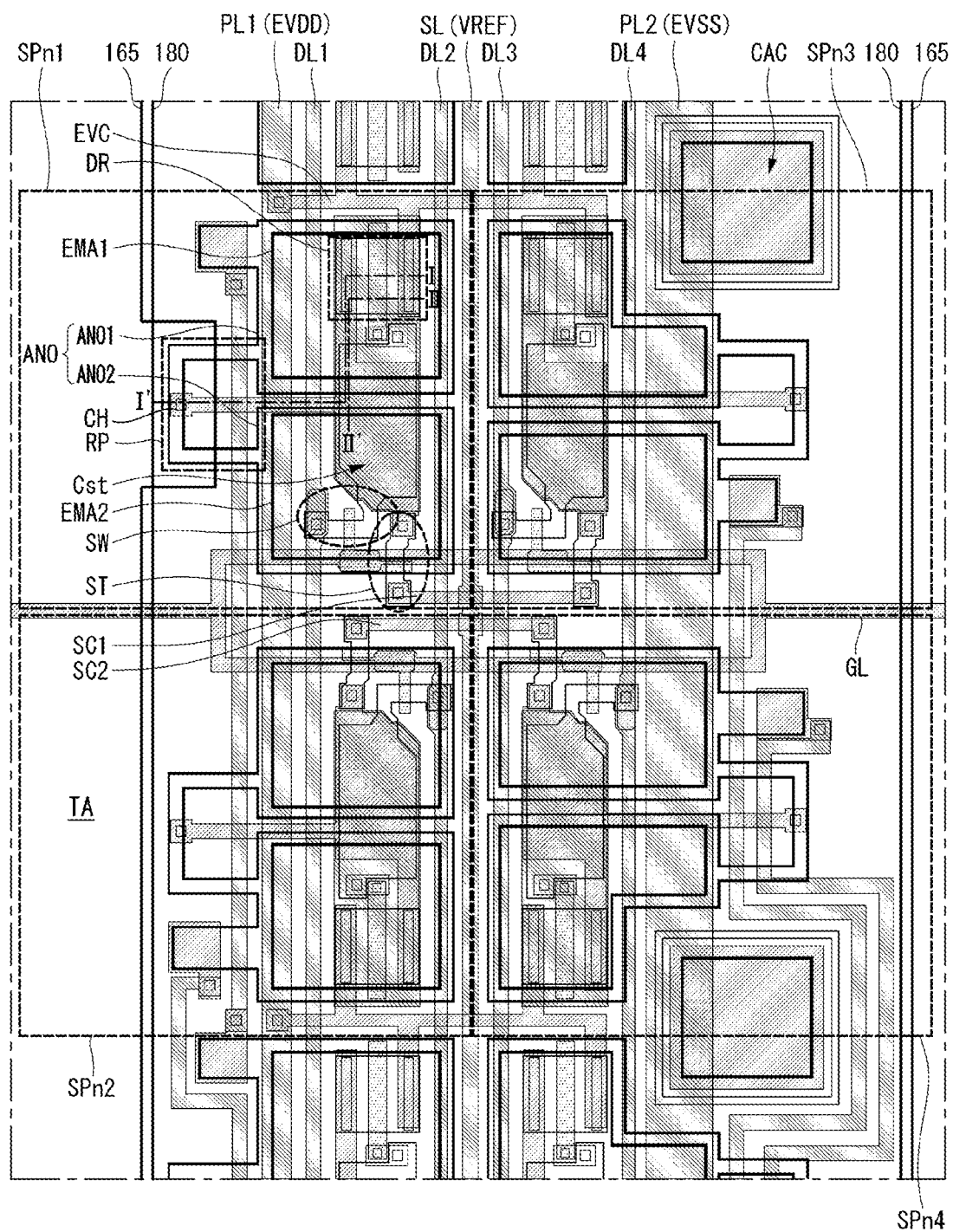
FIG. 4 is a top view of the organic light emitting display device according to an embodiment of the present disclosure.
Figure 5:
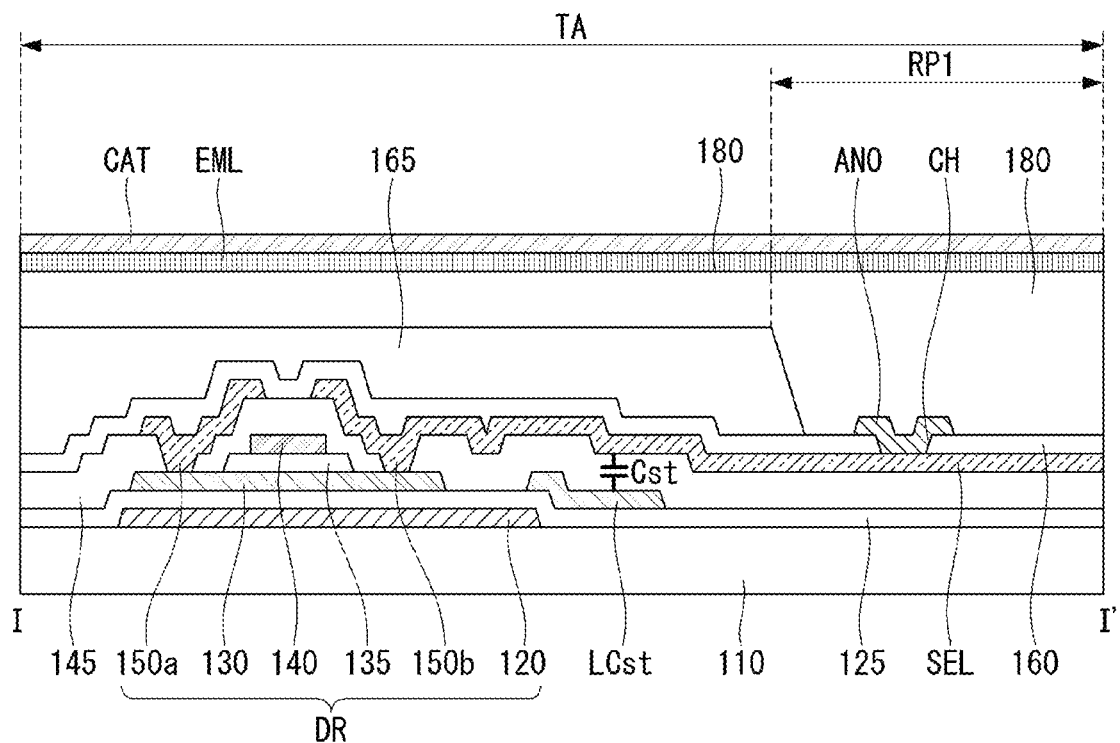
FIG. 5 is a cross sectional view taken along line I-I' of FIG. 4.
Figure 6:
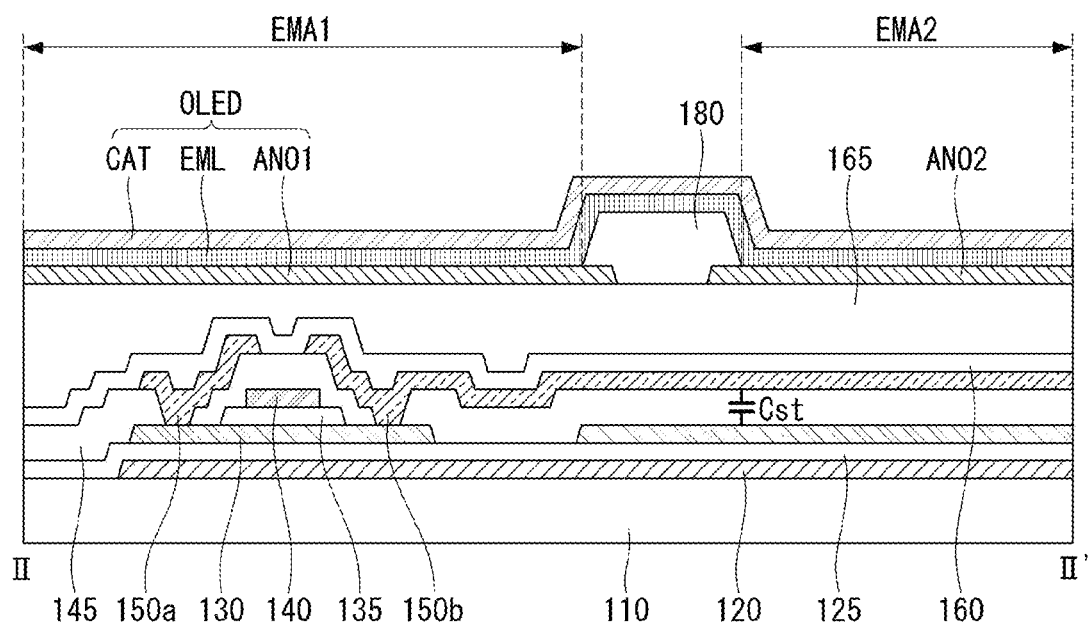
FIG. 6 is a cross sectional view taken along line II-II' of FIG. 4.

FIG. 4 is a top view of the organic light emitting display device according to the embodiment of the present disclosure. FIG. 5 is a cross sectional view taken along line I-I' of FIG. 4. FIG. 6 is a cross sectional view taken along line II-II' of FIG. 4.

Referring to FIG. 4, the organic light emitting display device of the present disclosure includes first to fourth sub-pixels SPn1 to SPn4 where the gate line GL and first to fourth data lines DL1 to DL4 are defined in an overlapping area. Each of the first to fourth sub-pixels SPn1 to SPn4 includes first and second light emitting parts EMA1 and EMA2 and a transmissive part TA that is a remaining area except for the first and second light emitting parts EMA1, EMA2.

The gate lines GL are connected to the sensing transistors ST and the switching transistors SW of the first to fourth sub-pixels SPn1 to SPn4.

The first to fourth sub-pixels SPn1 to SPn4 are connected in common to the sensing line SL to which the sensing voltage VREF is applied. The sensing line SL is connected to the sensing transistors ST of the first to fourth sub-pixels SPn1 to SPn4 through first and second sensing connection lines SC1 and SC2. For example, the sensing line SL may be connected to the first sub-pixel SPn1 and the third sub-pixel SPn3 through the first sensing connection line SC1, and may be connected to the second sub-pixel SPn2 and the fourth sub-pixel SPn4 through the second sensing connection line SC2.

A first power line PL1 to which a high potential driving voltage EVDD is applied is disposed on one sides of the first and second sub-pixels SPn1 and SPn2. The first to fourth sub-pixels SPn1 to SPn4 are respectively connected to the first power line PL1 through a power connection line EVC. For example, the first power line PL1 is connected to the power connection line EVC, and the power connection line EVC is connected to the driving transistor DR of the first to fourth sub-pixels SPn1 to SPn4.

A second power line PL2 to which a low potential driving voltage EVSS is applied is disposed on one sides of the third and fourth sub-pixels SPn3 and SPn4. The second power line PL2 is connected to a second electrode (e.g., a cathode electrode) of the organic light emitting diode OLED.

Each of the first to fourth sub-pixels SPn1 to SPn4 includes the driving transistor DR, the capacitor Cst, the sensing transistor ST, and the switching transistor SW.

Each of the first to fourth sub-pixels SPn1 to SPn4 includes the first light emitting part EMA1 and the second light emitting part EMA2. In the embodiment, the first light emitting part EMA1 may be disposed to overlap the driving transistor DR, and the second light emitting part EMA2 may be disposed to overlap the sensing transistor ST and the switching transistor SW.

A first anode electrode ANO1 is disposed in the first light emitting part EMA1 provided in each of the first to fourth sub-pixels SPn1 to SPn4, and a second anode electrode ANO2 is disposed in the second light emitting part EMA2. The first anode electrode ANO1 and the second anode electrode ANO2 together or independently form the anode electrode ANO of the organic light emitting diode OLED. In the embodiment of FIG. 4, the first anode electrode ANO1 and the second anode electrode ANO2 are electrically connected to form the anode electrode ANO of the organic light emitting diode OLED together.

The anode electrode ANO is connected to the second electrode (e.g., a source electrode) of the driving transistor DR through a contact hole CH. In the embodiment, the contact hole CH is formed in a region where the first anode electrode ANO1 and the second anode electrode ANO2 branch. The anode electrode ANO may be connected to the second electrode of the driving transistor DR through the contact hole. The anode electrode ANO may be directly connected to the second electrode of the driving transistor DR, or may be connected to the second electrode of the driving transistor DR via one electrode of the capacitor Cst as shown.

The region where the first anode electrode ANO1 and the second anode electrode ANO2 branch is disposed within a repair part RP provided in the transmissive part TA. In this embodiment, the contact hole CH is disposed within the repair part RP. When any one of the first light emitting part EMA1 and the second light emitting part EMA2 malfunctions due to foreign substances that may occur during the process, disconnection may occur, within the repair part RP, between the contact hole and the anode electrode of the malfunctioning light emitting part. Then, the driving current is not applied from the driving transistor DR to the anode electrode of the malfunctioning light emitting part, and the malfunctioning light emitting part does not emit light. As such, the sub-pixel SP can be repaired by disconnecting the defective anode electrode from the driving transistor DR.

Hereinafter, a detailed stack structure of the organic light emitting display device will be described with reference to FIGS. 5 and 6.

The substrate 110 is a base substrate of the display panel 150 and may be a light-transmitting substrate. The substrate 110 may be a rigid substrate including glass or tempered glass, or may be a flexible substrate made of plastic. For example, the substrate 110 may be formed of a plastic material such as polyimide, polyethylene terephthalate (PET), polyethylene naphthalate (PEN), and polycarbonate (PC), etc. However, the material of the substrate 110 is not limited thereto.

A first conductive layer may be disposed on the substrate 110. The first conductive layer may include a light blocking layer 120. The light blocking layer 120 blocks external light from being incident and prevents a photocurrent from being generated in the thin film transistor. The first conductive layer may further include the data lines DL1 to DL4, the power lines PL1 and PL2, the sensing line SL, and the like.

A buffer layer 125 at least partially covers the first conductive layer. The buffer layer 125 may prevent diffusion of ions or impurities from the substrate 110 and may block moisture penetration. In addition, the buffer layer 125 may improve the surface flatness of the substrate 110. The buffer layer 125 may include inorganic materials such as oxides and nitrides, organic materials, or organic-inorganic composites, and may be formed as a single layer or multiple layers. For example, the buffer layer 125 may have a structure with a triple layer or more composed of silicon oxide, silicon nitride, and silicon oxide.

A semiconductor layer 130 is formed on the buffer layer 125. The semiconductor layer 130 may be formed of a silicon-based semiconductor material or an oxide-based semiconductor material. Amorphous silicon or polycrystalline silicon may be used as the silicon-based semiconductor material. The oxide-based semiconductor materials may include indium tin gallium zinc oxide (InSnGaZnO) that is a quaternary metal oxide, indium gallium zinc oxide (InGaZnO) that is a ternary metal oxide, indium tin zinc oxide (InSnZnO), indium aluminum zinc oxide (InAlZnO), tin Gallium zinc oxide (SnGaZnO), aluminum gallium zinc oxide (AlGaZnO), tin aluminum zinc oxide (SnAlZnO), indium zinc oxide (InZnO) that is a binary metal oxide, tin zinc oxide (SnZnO), aluminum zinc oxide (AlZnO), zinc magnesium oxide (ZnMgO), tin magnesium oxide (SnMgO), indium magnesium oxide (InMgO), indium gallium oxide (InGaO), indium oxide (InO), tin oxide (SnO), zinc oxide (ZnO), etc.

The semiconductor layer 130 may include a source region and a drain region including p-type or n-type impurities, and may include channels formed between the source region and the drain region, respectively.

A capacitor lower electrode LCst is further disposed on the buffer layer 125. The capacitor lower electrode LCst may be formed of the same material as that of the semiconductor layer 130. In the embodiment, the capacitor lower electrode LCst may be an extended portion of the semiconductor layer 130. In this embodiment, the capacitor lower electrode LCst is integrally formed with the semiconductor layer 130 and forms one pattern.

A second conductive layer is disposed on the semiconductor layer 130. A gate insulating layer 135 is interposed between the semiconductor layer 130 and the second conductive layer. The gate insulating layer 135 may be silicon oxide (SiOx), silicon nitride (SiNx), or multiple layers thereof.

The second conductive layer includes a gate electrode 140. The gate electrode 140 is disposed to overlap on the channel of the semiconductor layer 130. In the embodiment, the gate electrode 140 may be integrally formed with wires electrically connected to the corresponding gate electrode 140 and may form one pattern.

The second conductive layer is formed of any one selected from the group consisting of molybdenum (Mo), aluminum (Al), chromium (Cr), gold (Au), titanium (Ti), nickel (Ni), neodymium (Nd), and copper (Cu) or is formed of an alloy thereof. The second conductive layer may be formed of any one selected from the group consisting of molybdenum (Mo), aluminum (Al), chromium (Cr), gold (Au), titanium (Ti), nickel (Ni), neodymium (Nd), and copper (Cu) or may be multiple layers made of an alloy thereof. For example, the second conductive layer may be a double layer of molybdenum/aluminum-neodymium or molybdenum/aluminum.

An interlayer insulating layer 145 at least partially covers the second conductive layer. The interlayer insulating layer 145 may be a silicon oxide layer (SiOx), a silicon nitride layer (SiNx), or multiple layers thereof.

A third conductive layer is disposed on the interlayer insulating layer 145. The third conductive layer may include a drain electrode 150a and a source electrode 150b. The drain electrode 150a and the source electrode 150b are connected to the semiconductor layer 130 through the contact holes which expose the drain region and source region of the semiconductor layer 130 respectively. The semiconductor layer 130, the gate electrode 140, the drain electrode 150a, and the source electrode 150b may form one transistor. The driving transistor DR is shown as an example in FIGS. 5 and 6.

The third conductive layer further includes a capacitor upper electrode. The capacitor upper electrode is integrally formed with the source electrode 150b of the driving transistor DR and forms one pattern. That is, the source electrode 150b is disposed such that one region of the source electrode 150b overlaps with the capacitor lower electrode LCst, and functions as the capacitor upper electrode.

The third conductive layer may further include an extension line SEL. The extension line SEL may be composed of a portion extending substantially perpendicular to the first power line PL1 in a region of the capacitor upper electrode. Such an extension line SEL crosses the data line DL1 while crossing between the first light emitting part EMA1 and the second light emitting part EMA2. The extension line SEL extends from a region of the capacitor upper electrode to the repair part RP, and is connected to the below-described anode electrode ANO (more specifically, the first anode electrode ANO1 and the second anode electrode ANO2) through the contact hole CH.

The third conductive layer may be formed of a single layer or multiple layers. When the third conductive layer is a single layer, it may be composed of molybdenum (Mo), aluminum (Al), chromium (Cr), gold (Au), titanium (Ti), nickel (Ni), neodymium (Nd), and copper (Cu) or is formed of an alloy thereof. When the third conductive layer is composed of multiple layers, it may be formed of a double layer of molybdenum/aluminum-neodymium, a triple layer of titanium/aluminum/titanium, molybdenum/aluminum/molybdenum or molybdenum/aluminum-neodymium/molybdenum.

A passivation layer 160 at least partially covers the third conductive layer. The passivation layer 160 is an insulating layer for protecting devices thereunder, and may be a silicon oxide layer (SiOx), a silicon nitride layer (SiNx), or multiple layers thereof. The contact hole CH exposing a portion of the extension line SEL is formed in the passivation layer 160.

An overcoat layer 165 is disposed on the passivation layer 160. The overcoat layer 165 may be a planarization layer for mitigating a level difference in the lower structure, and may be composed of organic materials such as polyimide, benzocyclobutene series resin, acrylate, etc. The overcoat layer 165 may be formed by a spin on glass (SOG) method in which the organic material is coated in a liquefied form and then cured.

In the shown embodiment, the overcoat layer 165 is not formed on the contact hole CH, but exposes the contact hole CH to the top. However, the present embodiment is not limited thereto, and the overcoat layer 165 may be formed on the contact hole CH. In this embodiment, the contact hole CH may be formed to pass through both the overcoat layer 165 and the passivation layer 160.

The organic light emitting diode OLED is disposed on the substrate 110 on which circuit elements including the driving transistor DR are disposed. The organic light emitting diode OLED includes an anode electrode ANO, an emission material layer EML, and a cathode electrode CAT.

One of the anode electrode ANO and the cathode electrode CAT may be a transmissive electrode and the other may be a reflective electrode. For example, when the organic light emitting diode OLED has a back emission type, the anode electrode ANO may be a transmissive electrode, and the cathode electrode CAT may be a reflective electrode. Conversely, when the organic light emitting diode OLED has a front emission type, the anode electrode ANO may be a reflective electrode, and the cathode electrode CAT may be a transmissive electrode. In another example, when the organic light emitting diode OLED has a double-sided light emitting type, both the anode electrode ANO and the cathode electrode CAT may be transmissive electrodes. Hereinafter, a detailed configuration of the organic light emitting diode OLED will be described by taking the case where the organic light emitting diode OLED has a double-sided light emitting type as an example.

The anode electrode ANO may be formed on the overcoat layer 165 and/or on the passivation layer 160 where the overcoat layer 165 is not formed. For example, the anode electrode ANO may be formed on the passivation layer 160 within the repair part RP and may be formed on the overcoat layer 165 in the remaining areas other than the repair part RP. However, this embodiment is not limited thereto. That is, when the overcoat layer 165 is formed in at least one region of the repair part RP, at least a portion of the anode electrode ANO may be formed on the overcoat layer 165 within the repair part RP.

The anode electrode ANO may be made of a transparent conductive material such as indium tin oxide (ITO), indium zinc oxide (IZO), zinc oxide (ZnO) or the like. When the anode electrode ANO is a reflective electrode, the anode electrode ANO may further include a reflective layer. The reflective layer may be made of aluminum (Al), copper (Cu), silver (Ag), nickel (Ni), or an alloy thereof. In the embodiment, the reflective layer may be made of APC (silver/palladium/copper alloy).

The anode electrode ANO is connected to the extension line SEL through the passivation layer 160 or the contact hole CH passing through the passivation layer 160 and the overcoat layer 165. The anode electrode ANO is further connected to the capacitor upper electrode and the second electrode of the driving transistor DR via the extension line SEL. As such, when the anode electrode ANO is connected to the capacitor upper electrode and the second electrode of the driving transistor DR via the extension line SEL, the contact area is reduced compared to a case where the anode electrode is directly connected to the second electrode of the driving transistor DR or the large area capacitor upper electrode. Accordingly, in the present embodiment, the area of the light emitting parts EMA1 and EMA2 can be further increased, and the area of the transmissive portion TA may be prevented from being reduced by the contact hole CH.

A bank layer 180 which divides the sub-pixels SP is disposed on the substrate 110 including the anode electrode ANO. The bank layer 180 at least partially covers the edge of the anode electrode ANO and exposes the central region of the anode electrode ANO. The central region exposed without being covered by the bank layer 180 is defined as the light emitting parts EMA1 and EMA2. The bank layer 180 is made of an organic material such as polyimide, benzocyclobutene series resin, acrylate, etc.

The emission material layer EML is formed on the anode electrode ANO that is exposed without being covered by the bank layer 180. The emission material layer EML may have a multilayer thin film structure including a light generating layer. Here, the color of light generated by the light generating layer may be white, red, blue, green, or the like, but is not limited thereto.

The light generation layer may include, for example, a hole transport layer (HTL), an organic light emitting layer, and an electron transport layer (ETL). The hole transport layer serves to easily transfer holes injected from the anode electrode ANO to the organic light emitting layer. The organic light emitting layer may be formed of an organic material including phosphorescent or fluorescent material. The electron transport layer serves to easily transfer electrons injected from the cathode electrode CAT to the organic light emitting layer. In addition to the hole transport layer, organic light emitting layer, and electron transport layer, the emission material layer (EML) may further include a hole injection layer (HIL), a hole blocking layer (HBL), an electron injection layer (EIL), and an electron blocking layer (EBL).

The emission material layer EML may be formed in a tandem structure of two or more stacks. In this case, each of the stacks may include a hole transport layer, an organic light emitting layer, and an electron transport layer. When the emission material layer EML may be formed in a tandem structure of two or more stacks, a charge generation layer may be formed between the stacks. The charge generation layer may include an n-type charge generation layer positioned adjacent to the lower stack and a p-type charge generation layer which is formed on the n-type charge generation layer and is positioned adjacent to the upper stack. The n-type charge generation layer injects electrons into the lower stack, and the p-type charge generation layer injects holes into the upper stack. The n-type charge generation layer may be an organic layer obtained by doping an organic host material having electron transport capability with an alkali metal such as lithium (Li), sodium (Na), potassium (K), or cesium (Cs), or an alkaline earth metal such as magnesium (Mg), strontium (Sr), barium (Ba), or radium (Ra). The p-type charge generation layer may be an organic layer obtained by doping an organic host material having hole transport capability with a dopant.

The cathode electrode CAT is formed on the emission material layer EML. The cathode electrode CAT may be widely formed in the light emitting parts EMA1 and EMA2 and in a non-emitting area around the light emitting parts EMA1 and EMA2.

The cathode electrode CAT may be made of a transparent conductive material (TCO) or a semi-transmissive conductive material such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) and alloys thereof. When the cathode electrode CAT is made of the semi-transmissive conductive material, a light emission efficiency may be increased due to micro cavities.

The cathode electrode CAT is connected to the second power line PL2 in a cathode contact part CAC. Specifically, in the cathode contact part CAC, the cathode electrode CAT is disposed to overlap the second power line PL2, and the buffer layer 125 and the interlayer insulating layer 145 are interposed between the cathode electrode CAT and the second power line PL2. The cathode electrode CAT may be connected to the second power line PL2 through the contact hole that passes through the buffer layer 125 and the interlayer insulating layer 145 and exposes the second power line PL2.

Hereinafter, a repair method of the sub-pixel SP through the repair part RP will be described in more detail.

Figure 7:
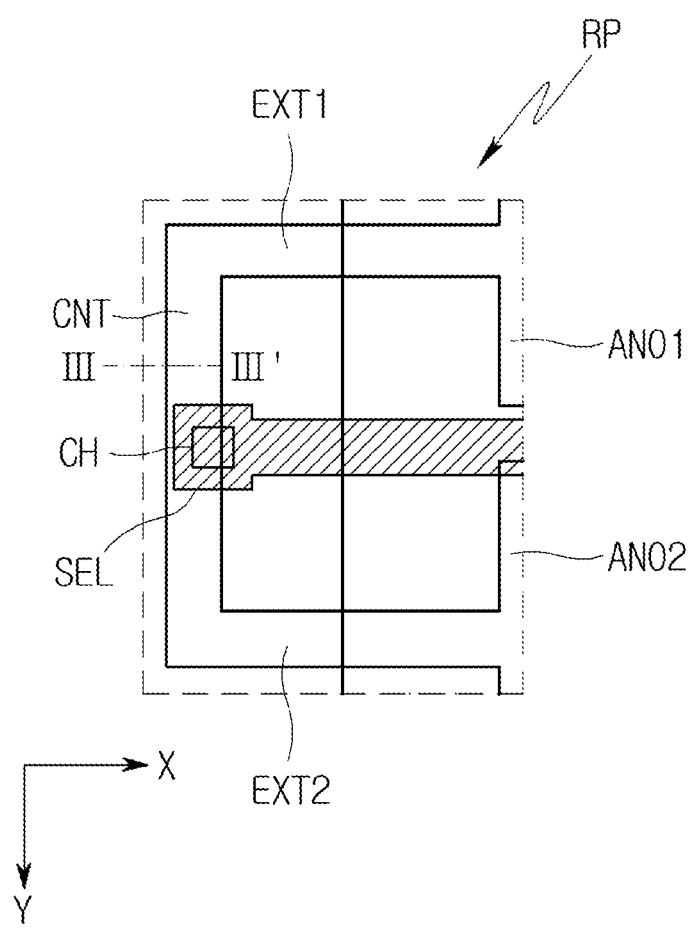
FIG. 7 is an enlarged view of a repair part according to a first embodiment.
Figure 8:
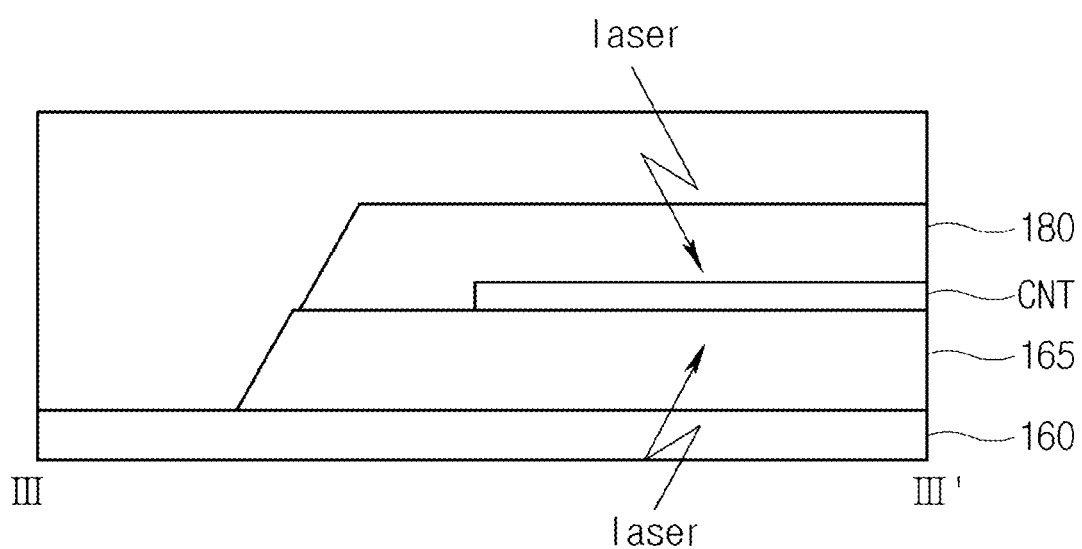
FIG. 8 is a cross sectional view taken along line III-III' of FIG. 7.

FIG. 7 is an enlarged view of the repair part according to a first embodiment. FIG. 8 is a cross sectional view taken along line of FIG. 7. In FIG. 8, for convenience of description, components that are not related to pixel repair have been omitted.

Referring to FIGS. 7 and 8 together with FIG. 4, in the first embodiment, the first anode electrode ANO1 has a first extension part EXT1 extending along the X axis from the first light emitting part EMA1 toward the repair part RP. Also, the second anode electrode ANO2 has a second extension part EXT2 extending along the X axis from the second light emitting part EMA2 toward the repair part RP. The second extension part EXT2 is disposed apart from the first extension part EXT1.

The first extension part EXT1 and the second extension part EXT2 are connected to each other by a connection pattern CNT extending along the Y axis substantially perpendicular to the X axis. For example, one end of the connection pattern CNT may be connected to the first extension part EXT1 and the other end of the connection pattern CNT may be connected to the second extension part EXT2.

The connection pattern CNT is disposed to partially overlap the extension line SEL. Within the repair part RP, the contact hole CH is formed in a region where the connection pattern CNT and the extension line SEL overlap. The contact hole CH is formed to pass through at least one layer interposed between the connection pattern CNT and the extension line SEL and exposes the lower extension line SEL. For example, the contact hole CH is formed to pass through at least one of the passivation layer 160 and the overcoat layer 165. The connection pattern CNT may be connected to the extension line SEL through the contact hole CH.

In the same or similar manner as described above, the anode electrode ANO is connected to the extension line SEL through the contact hole CH on the connection pattern CNT. Since the extension line SEL forms one pattern together with the second electrode 150b of the driving transistor DR and the capacitor upper electrode, the anode electrode ANO is electrically connected to the second electrode 150b of the driving transistor DR and the capacitor upper electrode via the extension line SEL.

In the embodiment, when foreign substances or the like penetrate into the light emitting parts EMA1 and EMA2 and the corresponding light emitting part does not emit light with correct luminance, image quality degradation of the display panel 150 can be prevented by blocking the light emission of the corresponding light emitting part. In order to prevent the driving current from being applied to the corresponding anode electrodes ANO1 and ANO2, the electrical connection from the driving transistor DR to the corresponding anode electrodes ANO1 and ANO2 is disconnected. Specifically, within the repair part RP, the extension parts EXT1 and EXT2 of the corresponding anode electrodes ANO1 and ANO2 and/or the connection pattern CNT may be laser cut.

For example, when a malfunction occurs in the first light emitting part EMA1, a laser beam is irradiated on the connection pattern CNT or the first extension part EXT1 of the first anode electrode ANO1, so that the first extension part EXT1 or the connection pattern CNT can be cut. When a laser beam is irradiated on the connection pattern CNT, the laser beam is irradiated between the contact hole CH and one end of the connection pattern CNT connected to the first extension part EXT1. FIG. 8 shows an example in which a laser beam is irradiated on the top and/or bottom surfaces of the connection pattern CNT.

Since the second anode electrode ANO2 maintains the electrical connection with the driving transistor DR through the contact hole CH, the second anode electrode ANO2 can operate normally regardless of the laser cutting of the first anode electrode ANO1.

Figure 9:
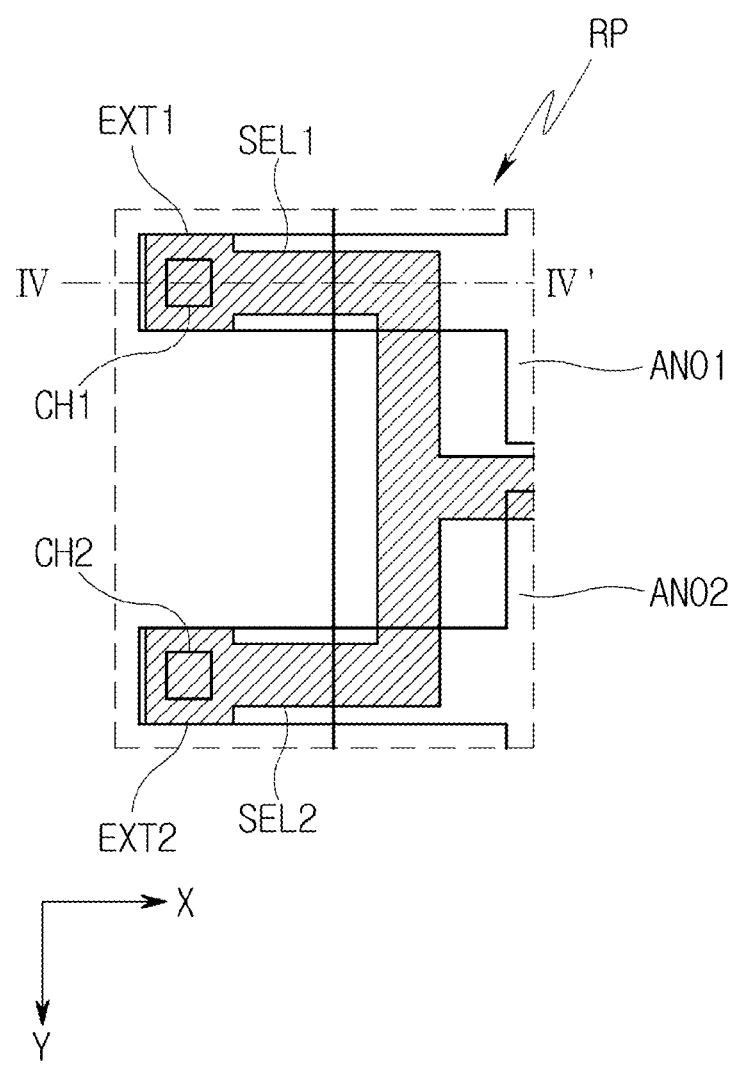
FIG. 9 is an enlarged view of the repair part according to a second embodiment.
Figure 10:
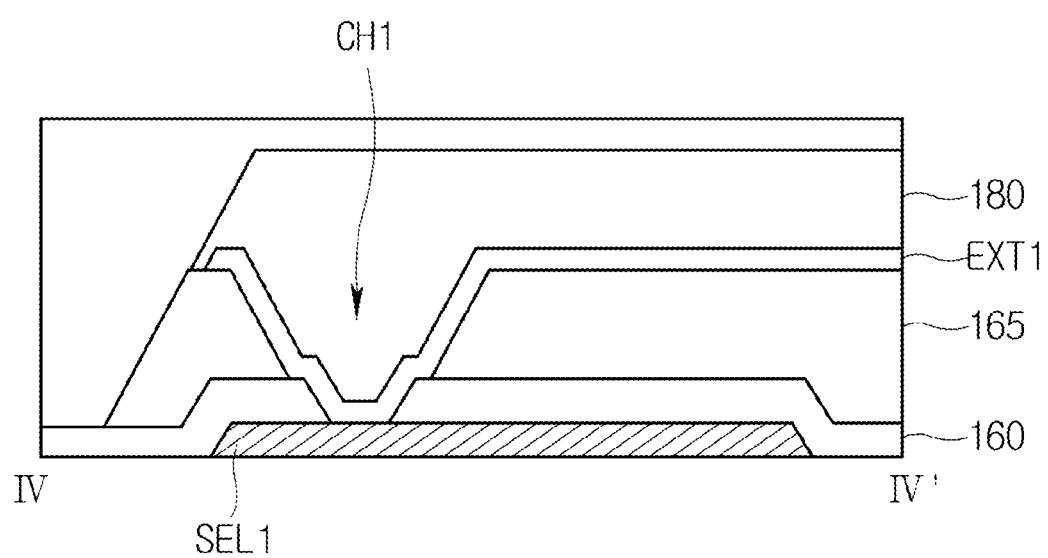
FIG. 10 is a cross sectional view taken along line IV-IV' of FIG. 9.
Figure 11:
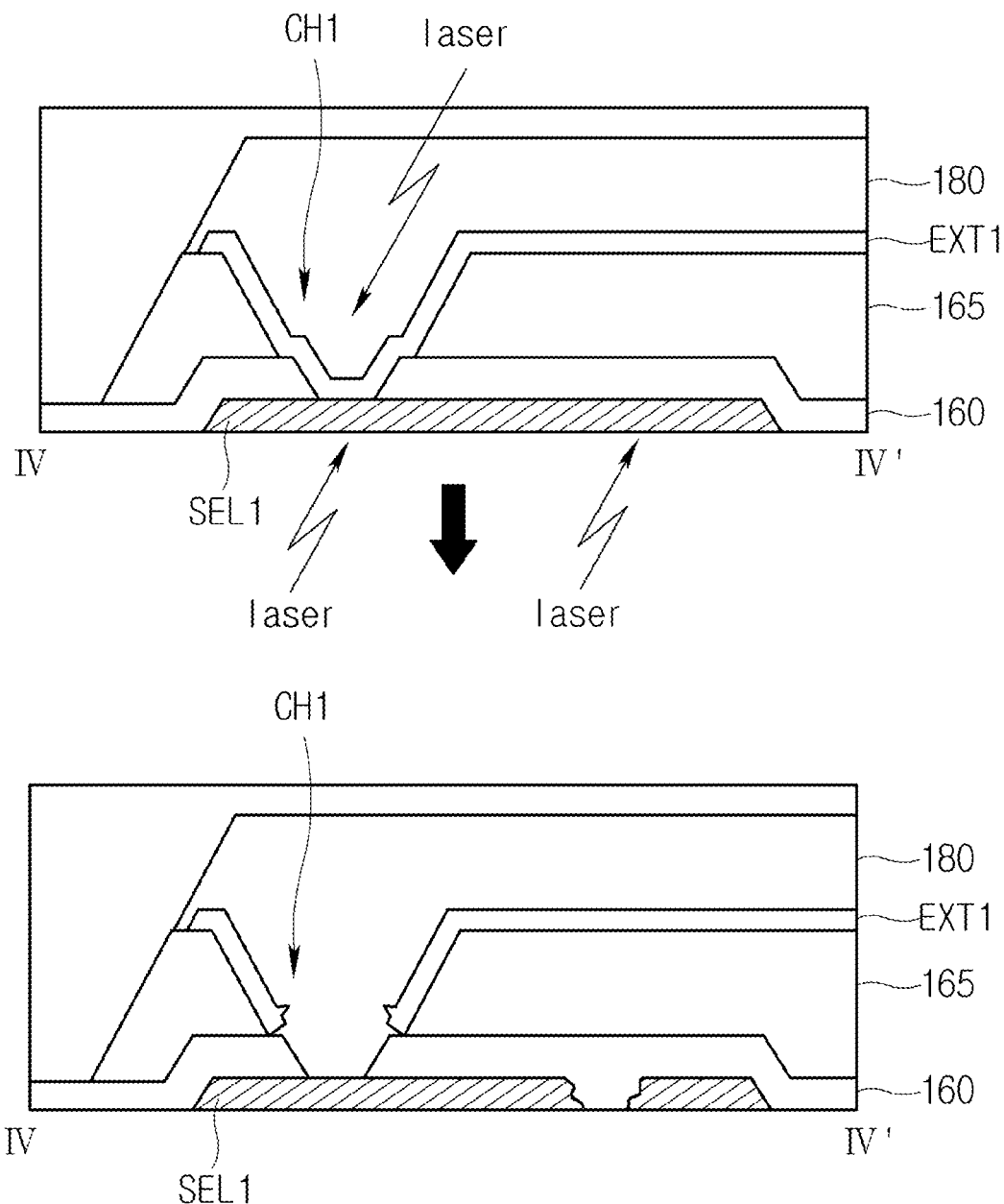
FIG. 11 is a cross sectional view for describing a laser cutting method for pixel repair of the organic light emitting display device shown in FIG. 10.

FIG. 9 is an enlarged view of the repair part according to a second embodiment. FIG. 10 is a cross sectional view taken along line of FIG. 9. FIG. 11 is a cross sectional view for describing a laser cutting method for pixel repair of the organic light emitting display device shown in FIG. 10. In FIGS. 9 to 11, components that are not related to the pixel repair have been omitted.

Referring to FIGS. 9 and 10 together, in the second embodiment, the first anode electrode ANO1 has the first extension part EXT1 extending along the X axis from the first light emitting part EMA1 toward the repair part RP. Also, the second anode electrode ANO2 has the second extension part EXT2 extending along the X axis from the second light emitting part EMA2 toward the repair part RP.

The first extension part EXT1 and the second extension part EXT2 are disposed to partially overlap the extension line SEL. In order to overlap with both the first and second extensions EXT1 and EXT2, the extension line SEL may have various patterns. For example, the extension line SEL may be composed of a first extension line SEL1 which overlaps with the first extension part EXT1 and extends along the X-axis and a second extension line SEL2 which overlaps with the second extension part EXT2 and extends along the X-axis. The first extension line SEL1 and the second extension line SEL2 may be extension parts which are branched off from the one end of the extension line SEL and have a shape bent at a right angle. However, the shape of the extension line SEL is not limited thereto. For example, the first extension line SEL1 and the second extension line SEL2 may be extension parts which extend from the capacity upper electrode along the X-axis direction.

A first contact hole CH1 is formed in a region where the first extension part EXT1 and the extension line SEL overlap, and a second contact hole CH2 is formed in a region where the second extension part EXT2 and the extension line SEL overlap. The first contact hole CH1 and the second contact hole CH2 are formed to pass through at least one layer interposed between the extension parts EXT1 and EXT2 and the extension line SEL and expose the lower extension line SEL. The first extension part EXT1 and the second extension part EXT2 may be connected to the first extension line SEL1 and the second extension line SEL2 respectively through the first contact hole CH1 and the second contact hole CH2.

As described above, the first anode electrode ANO1 and the second anode electrode ANO2 are independently connected to the extension line SEL. Since the extension line SEL forms one pattern together with the second electrode 150b of the driving transistor DR and the capacitor upper electrode, the first anode electrode ANO1 and the second anode electrode ANO2 are independently connected to the second electrode 150b of the driving transistor DR and the capacitor upper electrode via the extension line SEL.

In the embodiment, when a malfunction occurs in one of the light emitting parts EMA1 and EMA2, the electrical connection from the driving transistor DR to the corresponding anode electrode is disconnected. Specifically, within the repair part RP, the extension parts EXT1 and EXT2 of the corresponding anode electrodes ANO1 and ANO2 may be laser cut. For example, the contact holes CH1 and CH2 may be destroyed by irradiating laser to the contact holes CH1 and CH2. When the extension lines SEL1 and SEL2 are exposed to the transmissive part TA, laser is irradiated to the extension lines SEL1 and SEL2 from below and the extension lines SEL1 and SEL2 may be cut.

Referring to FIG. 11, in this embodiment, for laser cutting, a laser beam is irradiated to the contact holes CH1 and CH2 of the extension parts EXT1 and EXT2. For example, when a malfunction occurs in the first light emitting part EMA1, a laser beam is irradiated to the first contact hole CH1 and the first extension part EXT1 formed within the first contact hole CH1 may be cut.

Alternatively, when a malfunction occurs in the first light emitting part EMA1, laser is irradiated to the first extension line SEL1 from below and the first extension line SEL1 may be cut.

For convenience of description, FIG. 11 shows an example in which both the first contact hole CH1 and the first extension line SEL1 are cut. However, in some embodiments, only one of the first contact hole CH1 and the first extension line SEL1 may be cut.

Since the first anode electrode ANO1 and the second anode electrode ANO2 are independently connected to the driving transistor DR, one anode electrode can operate normally regardless of the laser cutting of the other anode electrode.

Figure 12:
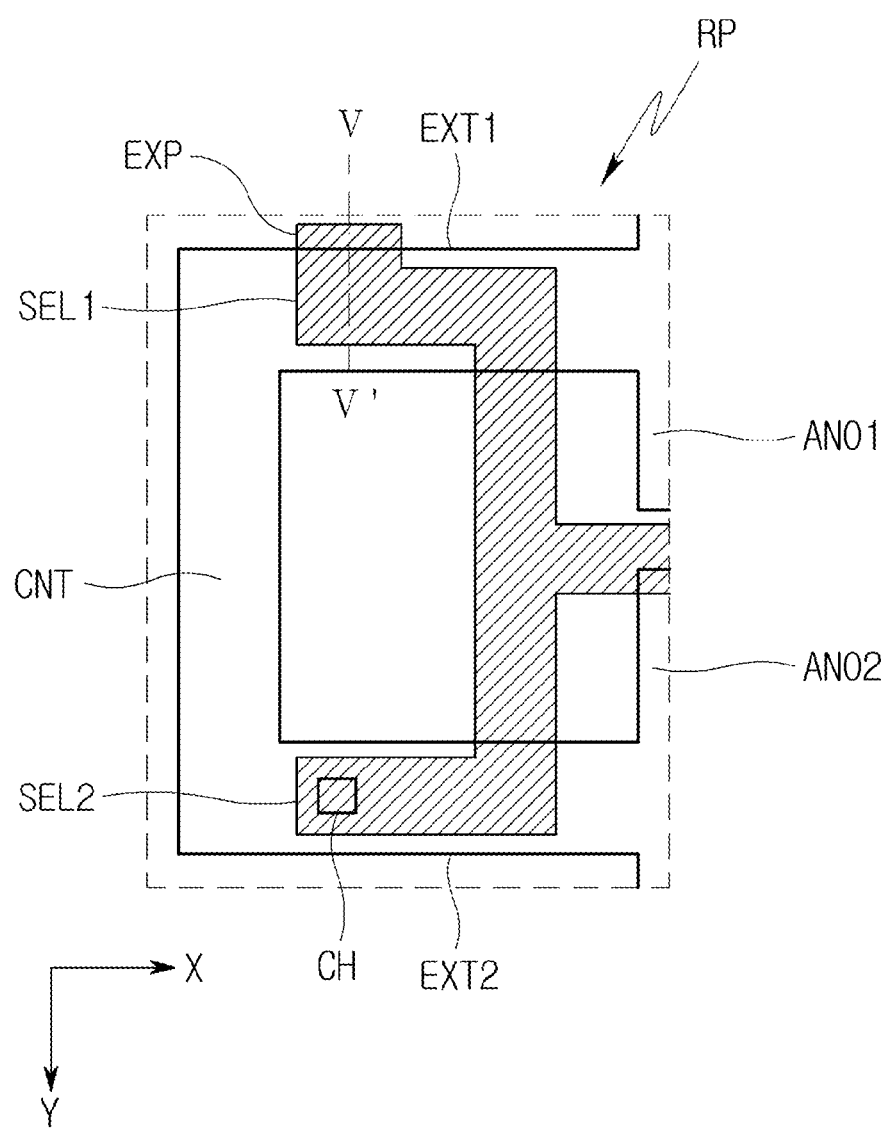
FIG. 12 is an enlarged view of the repair part according to a third embodiment.
Figure 13:
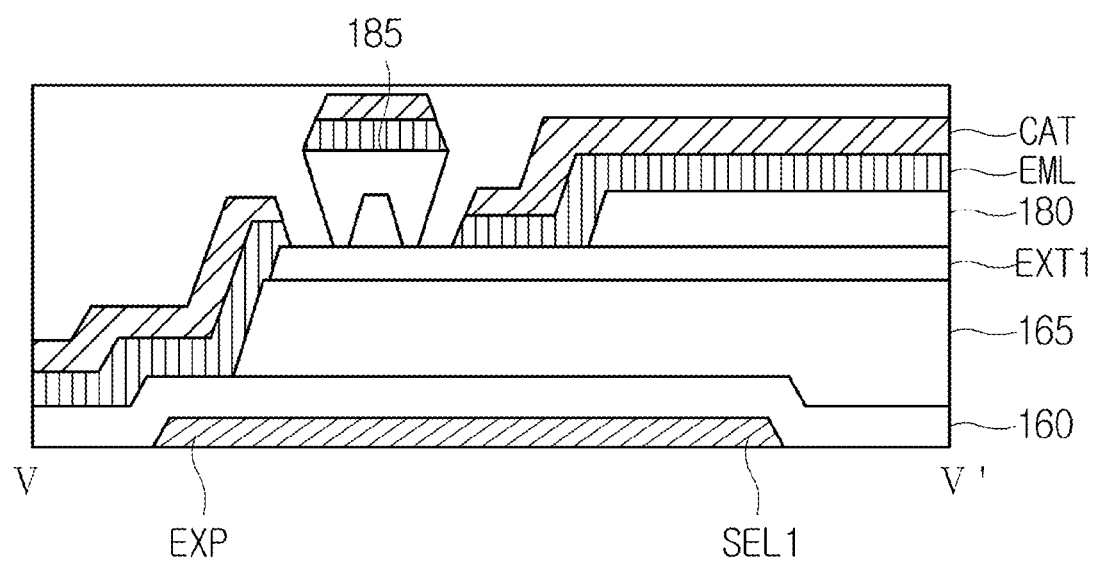
FIG. 13 shows an embodiment of a cross sectional view taken along line V-V' of FIG. 12.
Figure 14:
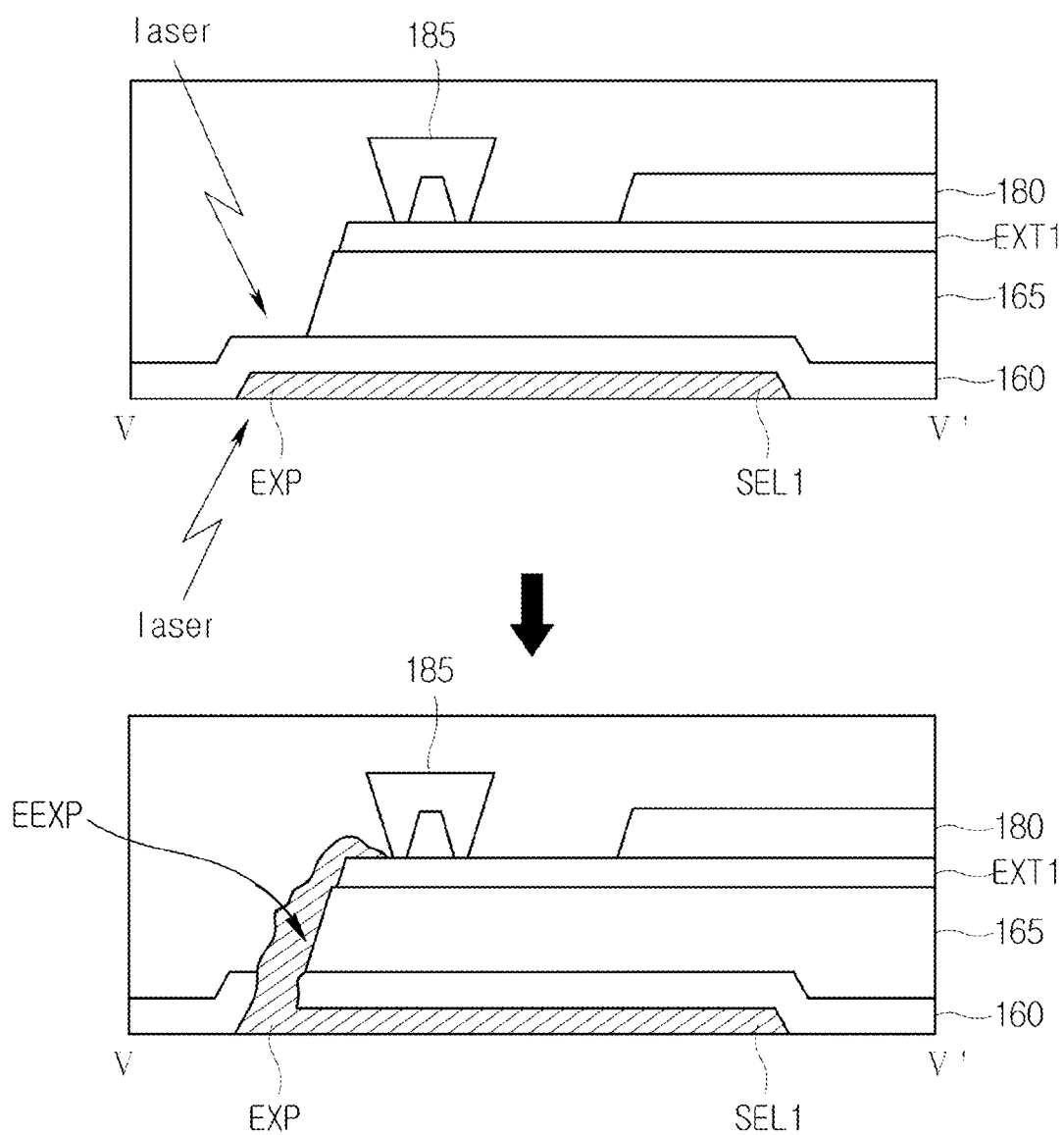
FIG. 14 is a cross sectional view for describing a laser welding method for pixel repair of the organic light emitting display device shown in FIG. 13.

FIG. 12 is an enlarged view of the repair part according to a third embodiment. FIG. 13 shows an embodiment of a cross sectional view taken along line V-V' of FIG. 12. FIG. 14 is a cross sectional view for describing a laser welding method for the pixel repair of the organic light emitting display device shown in FIG. 13. In FIGS. 12 to 14, for convenience of description, components that are not related to the pixel repair have been omitted. In particular, while FIG. 13 shows the cathode electrode CAT and the emission material layer EML on the anode electrodes ANO1 and ANO2, they are omitted for convenience in FIG. 14.

Referring to FIGS. 12 and 13 together, in the third embodiment, the first anode electrode ANO1 has the first extension part EXT1 extending along the X axis from the first light emitting part EMA1 toward the repair part RP. Also, the second anode electrode ANO2 has the second extension part EXT2 extending along the X axis from the second light emitting part EMA2 toward the repair part RP. The second extension part EXT2 is disposed apart from the first extension part EXT1.

The first extension part EXT1 and the second extension part EXT2 are connected to each other by the connection pattern CNT extending along the Y axis substantially perpendicular to the X axis. For example, one end of the connection pattern CNT may be connected to the first extension part EXT1 and the other end of the connection pattern CNT may be connected to the second extension part EXT2.

The first extension part EXT1 and the second extension part EXT2 are disposed to partially overlap the extension line SEL. In order to overlap with both the first and second extensions EXT1 and EXT2, the extension line SEL may have various patterns. For example, the extension line SEL may be composed of the first extension line SEL1 which overlaps with the first extension part EXT1 and extends along the X-axis and the second extension line SEL2 which overlaps with the second extension part EXT2 and extends along the X-axis. The first extension line SEL1 and the second extension line SEL2 may be extension parts which are branched off from the one end of the extension line SEL and have a shape bent at a right angle. However, the shape of the extension line SEL is not limited thereto. For example, the first extension line SEL1 and the second extension line SEL2 may be extension parts which extend from the capacity upper electrode along the X-axis direction.

The contact hole CH is formed in a region where one of the first extension part EXT1 and the second extension part EXT2 and the extension line SEL overlap. In the shown embodiment, the contact hole CH is formed in a region where the second extension part EXT2 and the second extension line SEL2 overlap. The contact hole CH is formed to pass through at least one layer interposed between the corresponding second extension part EXT2 and the second extension line SEL2 and exposes the lower second extension line SEL2. The second anode electrode ANO2 may be connected to the second electrode 150b of the driving transistor DR through the second extension part EXT2 and the contact hole CH.

Since the first extension part EXT1 and the second extension part EXT2 are connected to each other by the connection pattern CNT, the first extension part EXT1 may be connected to the second electrode 150b of the driving transistor DR via the connection pattern CNT and the second extension part EXT2. That is, the first anode electrode ANO1 is connected to the second electrode 150b of the driving transistor DR via the second anode electrode ANO2.

In this embodiment, the extension line SEL may have an exposed part EXP that does not overlap with the first extension portion EXT1 and/or the second extension portion EXT2 within the repair part RP. The exposed part EXP is formed adjacent to the anode electrode ANO, particularly, the extension parts EXT1 and EXT2 of the anode electrode ANO. For example, the exposed part EXP may have a pattern which protrudes outward from one side of the extension line SEL overlapping the extension parts EXT1 and EXT2 to the outside of the extension parts EXT1 and EXT2. However, the shape of the exposed part EXP is not limited thereto.

In the embodiment, the extension line SEL may have the exposed part EXP, only for the extension parts EXT1 and EXT2 of the anode electrodes ANO1 and ANO2 connected to the driving transistor DR via other anode electrodes ANO1 and ANO2. In the shown embodiment, since the first anode electrode ANO1 is connected to the driving transistor DR via the second anode electrode ANO2, the first extension line SEL1 has the exposed part EXP which is not covered by the first extension part EXT1. However, this embodiment is not limited thereto.

Referring to FIG. 13, in the repair part RP, the passivation layer 160 at least partially covers the extension line SEL. The overcoat layer 165 is formed on the passivation layer 160. Here, the overcoat layer 165 is formed so as not to cover the exposed part EXP of the extension line SEL.

The extension parts EXT1 and EXT2 of the anode electrode ANO are formed on the overcoat layer 165. The bank layer 180 is formed on the anode electrode ANO in order to define the light emitting parts EMA1 and EMA2. In this embodiment, the bank layer 180 is formed to expose at least one region of the extension part (here, the first extension part EXT1) adjacent to the exposed part EXP of the extension line SEL.

In a region where the bank layer 180 is not formed, the first extension part EXT1 is exposed upward. A partition wall 185 is formed on the exposed first extension part EXT1. A side surface of the partition wall 185 has an inverse tapered shape. That is, the size of the lower portion of the partition wall 185 may be smaller than the size of the upper portion of the partition wall 185. Due to the inverse tapered shape of the partition wall 185, the cathode electrode CAT and the emission material layer EML which are formed later are formed so as not to cover the periphery of the lower portion of the partition wall 185. Accordingly, in the periphery of the partition wall 185, the first extension part EXT1 can be exposed upward without being covered by the emission material layer EML and the cathode electrode CAT.

Due to the partition wall 185, the first extension part EXT1 is exposed upward without being covered by the emission material layer EML and the cathode electrode CAT. Therefore, the first extension part EXT1 can easily contact with the extension line SEL (specifically, the exposed part EXP of the extension line SEL) eluted (flow outed) during a below-described repair process.

Meanwhile, in the shown embodiment, although the partition wall 185 covers the bank layer 180 patterned on the first extension part ETX1, the embodiment of the present disclosure is not limited thereto. That is, in various embodiments, the bank layer 180 may not be formed under the partition wall 185.

In the embodiment, when a malfunction occurs in one of the light emitting parts EMA1 and EMA2, the electrical connection from the driving transistor DR to the corresponding anode electrodes ANO1 and ANO2 is disconnected for the pixel repair. Specifically, within the repair part RP, the extension parts EXT1 and EXT2 of the corresponding anode electrodes ANO1 and ANO2 may be laser cut.

When the electrical connection between the first anode electrode ANO1 and the driving transistor DR is disconnected, a laser beam is, as described with reference to FIGS. 4 to 6, irradiated on the connection pattern CNT and/or the first extension part EXT1 of the first anode electrode ANO1, so that the first extension part EXT1 or the connection pattern CNT can be cut. Since the second anode electrode ANO2 maintains the electrical connection with the driving transistor DR through the contact hole CH, the second anode electrode ANO2 can operate normally regardless of the laser cutting of the first anode electrode ANO1.

When the electrical connection between the second anode electrode ANO2 and the driving transistor DR is disconnected, the second extension part EXT2 can be, as described with reference to FIG. 11, cut by irradiating a laser beam to the contact hole CH. Alternatively, the second extension line SEL2 or the connection pattern CNT can be cut by irradiating a laser beam to the second extension line SEL2 or the connection pattern CNT from below. Since the first anode electrode ANO1 is connected to the driving transistor DR via the second extension part EXT2, the electrical connection between the first anode electrode ANO1 and the driving transistor DR is disconnected by cutting the second extension part EXT2. Accordingly, laser welding may be beneficial in order to connect the first anode electrode ANO1 and the driving transistor DR after the laser cutting.

Referring to FIG. 14, in this embodiment, the laser welding is performed on the exposed parts EXP of the extension parts EXT1 and EXT2. When a laser beam is irradiated to the exposed part EXP, upper layers and the passivation layer 160 formed on the exposed part EXP are at least partially removed, and the exposed part EXP may be eluted. The eluted exposed part EEXP may at least partially cover a surface of the first extension part EXT1 exposed to the outside at a position adjacent to the eluted exposed part EEXP. As such, when the first extension part EXT1 and the eluted exposed part EEXP are connected to each other, an electrical connection between the first anode electrode ANO1 and the driving transistor DR may be made.

In the same or similar manner as described above, this embodiment repairs the malfunctioning sub-pixel SP. That is, when the first light emitting part EMA1 or the second light emitting part EMA2 is defective, repair may be performed in the same or similar manner as described above. In addition, in this embodiment, since the anode electrode ANO and the driving transistor DR are connected through the contact hole CH formed in the repair part RP via the extension line SEL, the area of the transmissive part TA can be prevented from being reduced by the contact hole CH. As a result, according to the embodiment, the pixel repair may be performed while preventing the area of the transmissive part TA from being reduced.

Figure 15:
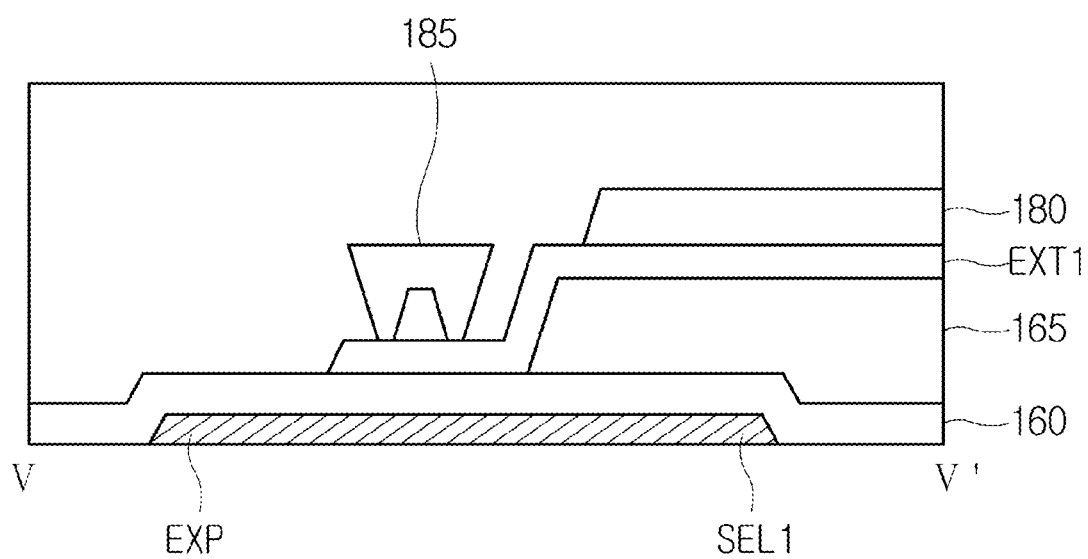
FIG. 15 shows another embodiment of a cross sectional view taken along line V-V' of FIG. 12.
Figure 16:
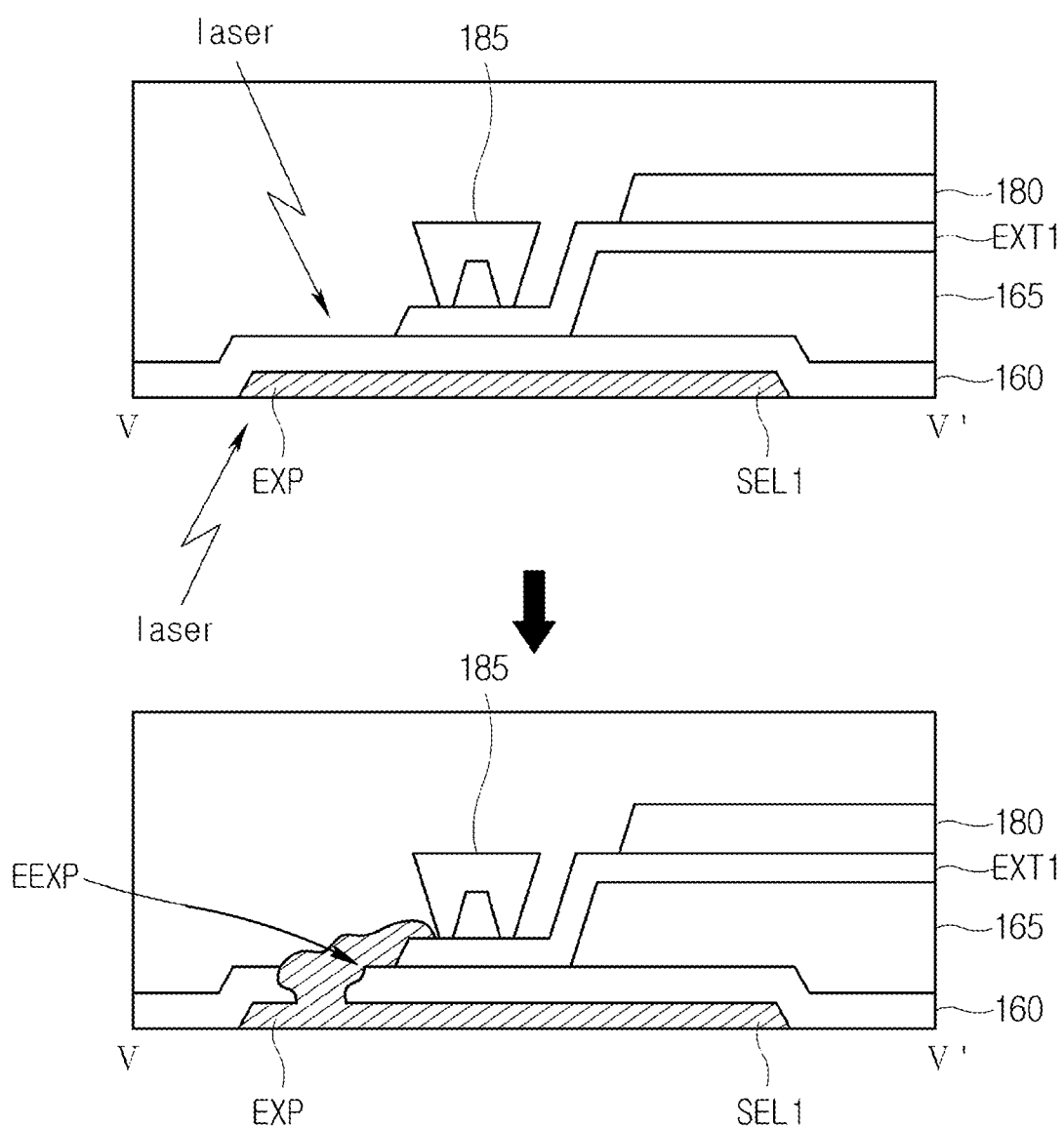
FIG. 16 is a cross sectional view for describing a laser welding method for pixel repair of the organic light emitting display device shown in FIG. 15.

FIG. 15 shows another embodiment of a cross sectional view taken along line V-V' of FIG. 12. FIG. 16 is a cross sectional view for describing a laser welding method for pixel repair of the organic light emitting display device shown in FIG. 15. In FIGS. 15 and 16, components that are not related to the pixel repair have been omitted.

Referring to FIG. 15, in the repair part RP, the passivation layer 160 at least partially covers the extension line SEL. The overcoat layer 165 is formed on the passivation layer 160. Here, the overcoat layer 165 is formed so as not to cover the exposed part EXP of the extension line SEL. In the shown embodiment, the overcoat layer 165 exposes the exposed part EXP of the first extension line SEL1 without covering it. In addition, in this embodiment, the overcoat layer 165 is formed to further expose a portion of the first extension line SEL1 adjacent to the exposed part EXP.

The extension parts EXT1 and EXT2 of the anode electrode ANO are formed on the overcoat layer 165. Since the overcoat layer 165 exposes a portion of the first extension line SEL1 adjacent to the exposed part EXP without covering it, the first extension portion EXT1 is formed on the passivation layer 160 in a region adjacent to the exposed part EXP. Accordingly, only the passivation layer 160 is interposed between the exposed part EXP and the first extension part EXT1 in the region adjacent to the exposed part EXP. Since the thickness of the passivation layer 160 is smaller than that of the overcoat layer 165, a distance between the first extension line SEL1 and the first extension part EXT1 in the embodiment shown in FIG. 15 is less than that of the embodiment shown in FIG. 13.

The bank layer 180 is formed on the anode electrode ANO in order to define the light emitting parts EMA1 and EMA2. The bank layer 180 is formed to expose at least one region of the first extension part EXT1 adjacent to the exposed part EXP of the extension line SEL. In this embodiment, the bank layer 180 is formed to expose at least a portion of the first extension portion EXT1, in a region in which the first extension portion EXT1 and the exposed part EXP are disposed to overlap each other with the passivation layer 160 interposed therebetween.

In the region where the bank layer 180 is not formed, the first extension part EXT1 is exposed upward. The partition wall 185 is formed on the exposed first extension part EXT1. A side surface of the partition wall 185 has an inverse tapered shape. That is, the size of the lower portion of the partition wall 185 may be smaller than the size of the upper portion of the partition wall 185. Due to the inverse tapered shape of the partition wall 185, the cathode electrode CAT and the emission material layer EML which are formed later are formed so as not to cover the periphery of the lower portion of the partition wall 185. Accordingly, in the periphery of the partition wall 185, the first extension part EXT1 can be exposed upward without being covered by the emission material layer EML and the cathode electrode CAT.

Meanwhile, in the shown embodiment, although the partition wall 185 covers the bank layer 180 patterned on the first extension part ETX1, the embodiment of the present disclosure is not limited thereto. That is, in various embodiments, the bank layer 180 may not be formed under the partition wall 185.

Referring to FIG. 16, when laser welding is performed, a laser beam is irradiated to the exposed part EXP. The laser beam may be irradiated to the surface of the exposed part EXP that does not overlap with the first extension part EXT1. When the laser beam is irradiated, upper layers and the passivation layer 160 formed on the exposed part EXP are removed, and a portion of the exposed part EXP may be eluted. The eluted exposed part EEXP may cover the surface of the first extension part EXT1 disposed to overlap the exposed part EXP.

The distance between the first extension line SEL1 and the first extension part EXT1 in this embodiment is relatively less than those of the embodiments shown in FIGS. 13 and 14. Accordingly, the laser welding between the first extension line SEL1 and the first extension part EXT1 can be performed more easily.

Figure 17:
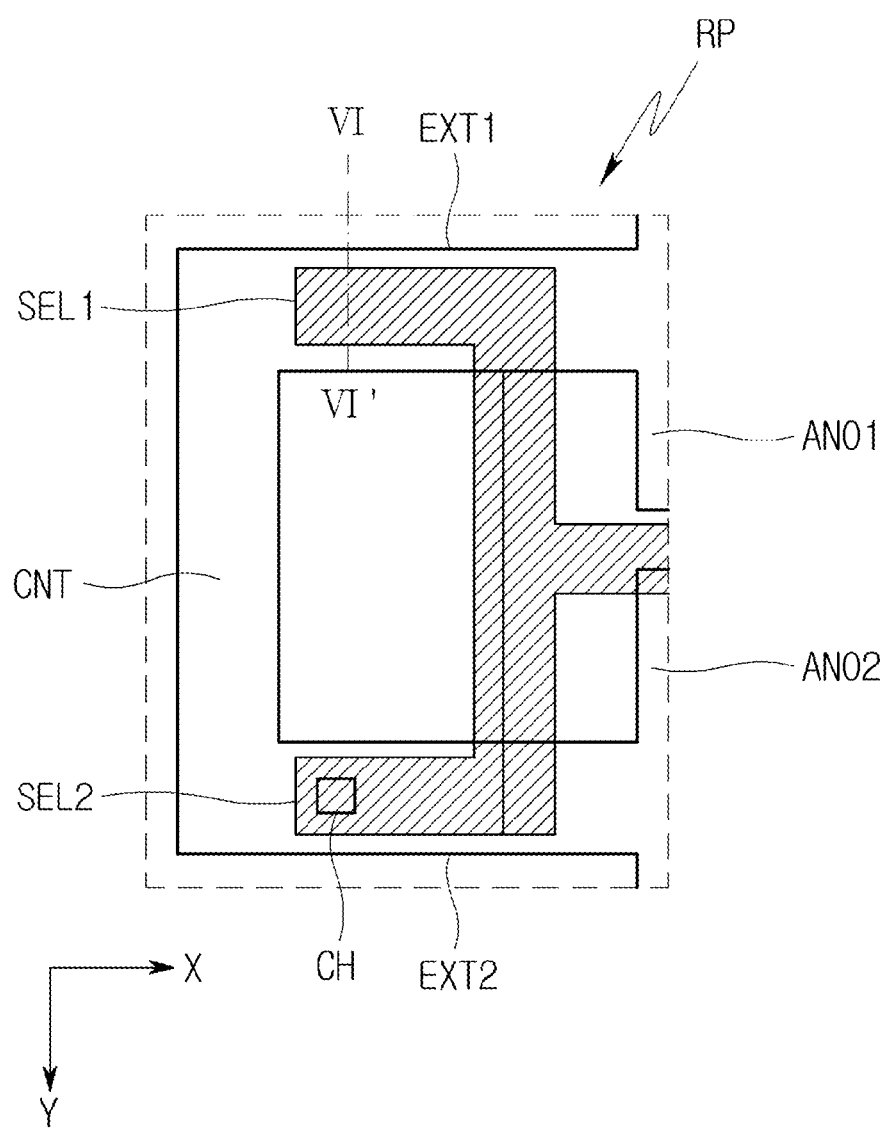
FIG. 17 is an enlarged view of the repair part according to a fourth embodiment.
Figure 18:
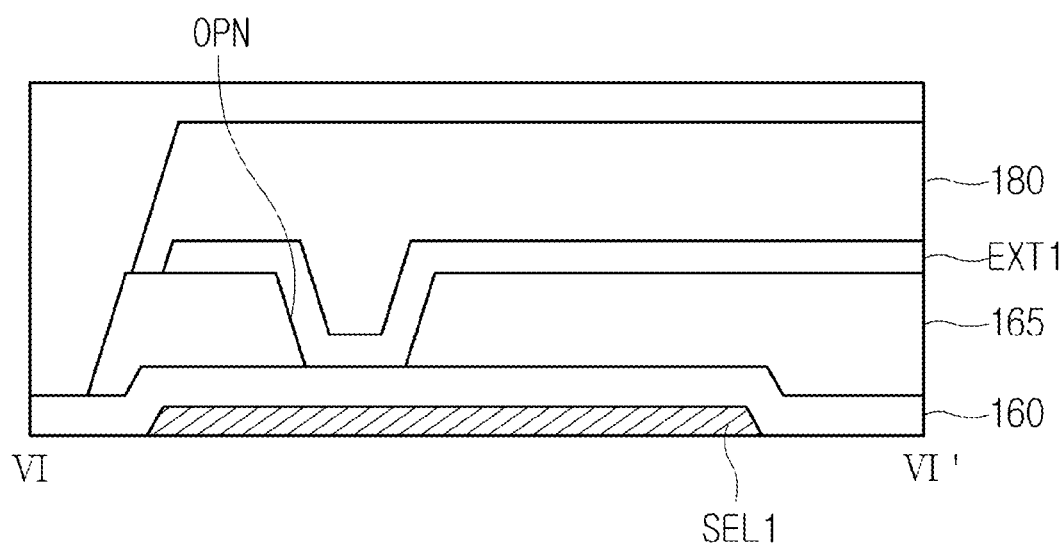
FIG. 18 shows another embodiment of a cross sectional view taken along line VI-VI' of FIG. 17.
Figure 19:
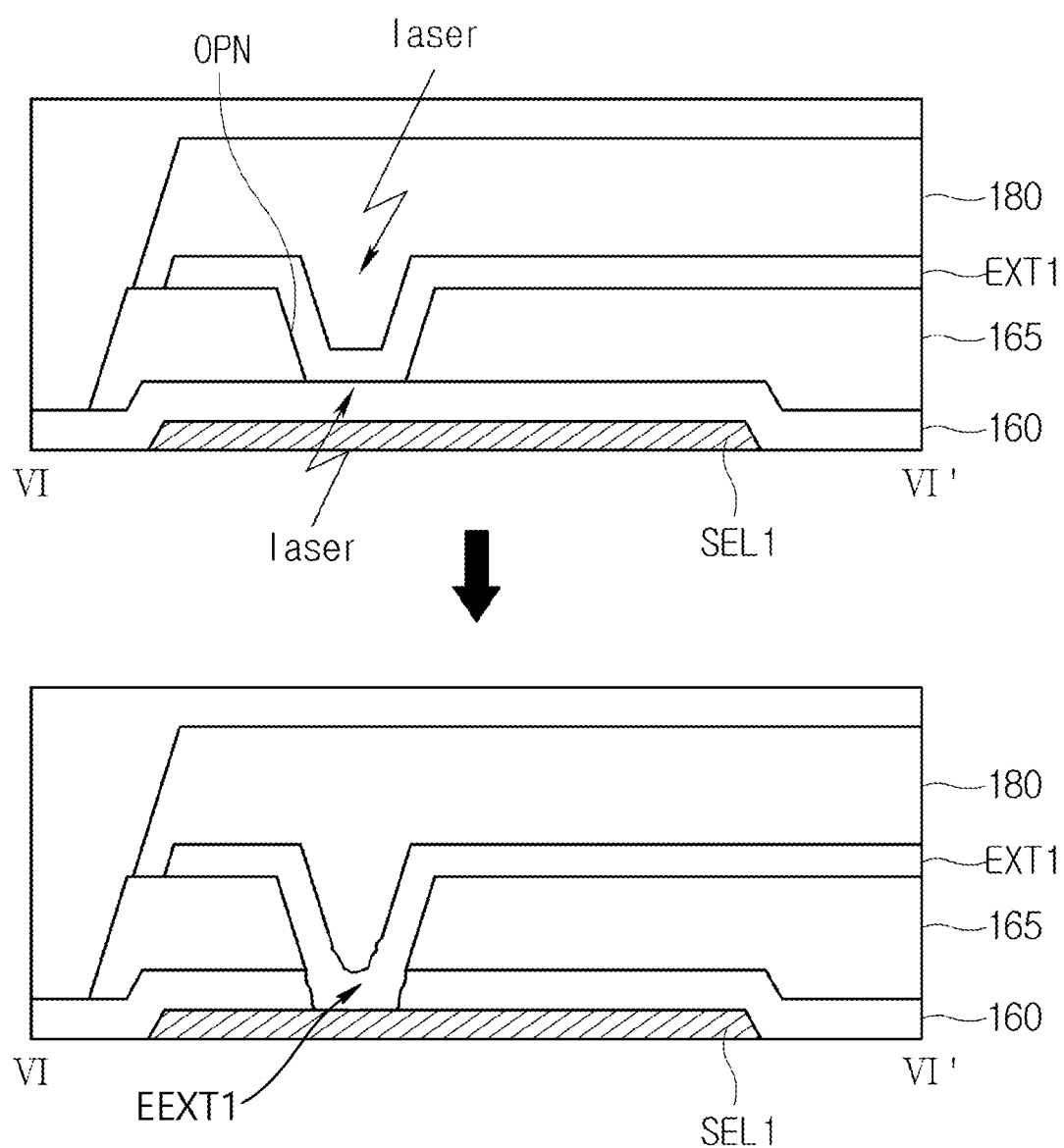
FIG. 19 is a cross sectional view for describing a laser welding method for pixel repair of the organic light emitting display device shown in FIG. 18.

FIG. 17 is an enlarged view of the repair part according to a fourth embodiment. FIG. 18 shows another embodiment of a cross sectional view taken along line VI-VI' of FIG. 17. FIG. 19 is a cross sectional view for describing a laser welding method for pixel repair of the organic light emitting display device shown in FIG. 18. In FIGS. 17 to 19, components that are not related to the pixel repair have been omitted.

Referring to FIGS. 17 and 18, the passivation layer 160 at least partially covers the extension line SEL. The overcoat layer 165 is formed on the passivation layer 160. Here, the overcoat layer 165 overlaps a region of the first extension line SEL1 and has an opening OPN exposing the passivation layer 160.

The anode electrode ANO is formed on the overcoat layer 165. The anode electrode ANO covers the exposed passivation layer 160 in the opening OPN formed in the overcoat layer 165. In this region, the distance between the first extension part EXT1 and the first extension line SEL1 may be relatively reduced.

Referring to FIG. 19, when laser welding is performed, a laser beam is irradiated to the opening OPN. When the laser beam is irradiated, the passivation film 160 interposed between the first extension part EXT1 and the first extension line SEL1 is at least partially removed, and the eluted first extension part EEXT1 covers the surface of the first extension line SEL1. Accordingly, an electrical connection is formed between the first extension part EXT1 and the first extension line SEL1 via the eluted first extension part EEXT1.

In this embodiment, compared to the previous embodiments, the structure of the repair part RP is relatively simple, so that the pixel repair process can be more easily performed.

While the embodiment of the present disclosure has been described with reference to the accompanying drawings, it can be understood by those skilled in the art that the present disclosure can be embodied in other specific forms without departing from its spirit or essential characteristics. Therefore, the foregoing embodiments and advantages are merely examples and are not to be construed as limiting the present disclosure. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

REFERENCE NUMERALS

PL1: First power line
PL2: Second cathode power line
SL: Sensing line
DL1~DL4: First to fourth data lines
GL: Gate line
ST: Sensing transistor
DR: Driving transistor
SW: Switching transistor
Cst: Capacitor
ANO: Anode electrode
ANO1: First anode electrode
ANO2: Second anode electrode
RP: Repair part
CAC: Cathode contact part
EMA1: First light emitting part
EMA2: Second light emitting part The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a substrate on which a sub-pixel including a transmissive part and a light emitting part is disposed;
a transistor disposed on the substrate; and
an organic light emitting diode connected to the transistor,
wherein the transmissive part includes a repair part in which an anode electrode of the organic light emitting diode is connected through a contact hole to an extension line extending from an electrode of the transistor,
wherein the extension line is branched off into a first extension line and a second extension line at one end, and at least one of the first and second extension lines comprises an exposed part formed adjacent to a first side of the anode electrode within the repair part, the extension line not overlapping with the anode electrode, and
wherein a partition wall having an inverted tapered side surface is formed on the first side of the anode electrode adjacent to the exposed part.

2. The display device of claim 1, wherein the anode electrode comprises:
a first anode electrode disposed on a first light emitting part and having a first extension part extending to the repair part; and
a second anode electrode disposed on a second light emitting part and having a second extension part extending to the repair part,
wherein the first extension part is connected to the extension line through a first contact hole, and the second extension part is connected to the extension line through a second contact hole.

3. The display device of claim 2, wherein, when the second light emitting part is defective, the second anode electrode is cut within the second contact hole or in the second extension part to be separated from the extension line.

4. The display device of claim 1, wherein the anode electrode comprises:
   a first anode electrode disposed in a first light emitting part; and
   a second anode electrode disposed in a second light emitting part,
   wherein the first anode electrode and the second anode electrode are extended to the repair part and are connected to each other within the repair part.

5. The display device of claim 4, further comprising:
   a passivation layer covering the extension line within the repair part; and
   an overcoat layer formed on the passivation layer and having an opening exposing a region of the passivation layer,
   wherein the first anode electrode is disposed on the overcoat layer such that at least one region of the first anode electrode overlaps with the opening and the extension line.

6. The display device of claim 5, wherein, when the first or the second light emitting part is defective, the passivation layer is removed within the opening and the extension line and the first anode electrode are connected to each other.

7. The display device of claim 1, further comprising:
   a light emitting layer of the organic light emitting diode covering the anode electrode and the partition wall; and
   a cathode electrode which is formed on the light emitting layer.

8. The display device of claim 7, wherein the first side of the anode electrode is not covered by the light emitting layer and the cathode electrode around the partition wall.

9. The display device of claim 7, wherein a passivation layer and an overcoat layer are interposed between the first side of the anode electrode and the extension line.

10. The display device of claim 7, wherein only a passivation layer is interposed between the first side of the anode electrode and the extension line.

11. The display device of claim 7, wherein the exposed part is a part protruding from a first side of the extension line overlapping with the first anode electrode to the outside of the first anode electrode.

12. The display device of claim 11, wherein, when the first or the second light emitting part is defective, the exposed part is connected to the first side of the first anode electrode.

13. A display device, comprising:
   a substrate on which a sub-pixel including a transmissive part and a light emitting part is disposed;
   a transistor on the substrate; and
   an organic light emitting diode connected to the transistor, the organic light emitting diode including an anode electrode, a cathode electrode and an emission material layer between the anode electrode and the cathode electrode,
   an extension part extended from the anode electrode;
   an extension line extending in a first direction;
   an exposed part continuously and contiguously connected to the extension line, the exposed part not overlapping the with extension part of the anode electrode in a vertical direction and a horizontal direction; and
   a passivation layer on the extension line.

14. The display device of claim 13, comprising:
   a partition wall on the extension part;
   wherein the partition wall does not overlap with the extension part of the anode electrode in a vertical direction and a horizontal direction.

15. The display device of claim 14, wherein the emission material layer of the organic light emitting diode is disposed on a top surface of the partition wall, and
   wherein the emission material layer on the top surface of the partition wall is disconnected from the emission material layer of the organic light emitting diode extending in a direction toward the partition wall at a side surface of the partition wall.

16. The display device of claim 14, wherein the cathode electrode of the organic light emitting diode is disposed on a top surface of the emission material layer at the partition wall, and
   wherein the cathode electrode on the top surface of the emission material layer at the partition wall is disconnected from the cathode electrode of the organic light emitting diode extending in a direction toward the partition wall at a side surface of the partition wall.

17. The display device of claim 14, wherein, during repair operation of the display device, the exposed part of the extension line is caused to be eluted, by a light-emitting source, such that the eluted part of the exposed part of the extension line is connected to the extension part of the anode electrode.

18. The display device of claim 14, wherein the eluted part of the exposed part of the extension line does not extend over the partition wall.

19. A display device, comprising:
   a substrate on which a sub-pixel including a transmissive part and a light emitting part is disposed;
   a transistor on the substrate; and
   an organic light emitting diode connected to the transistor, the organic light emitting diode including an anode electrode, a cathode electrode and an emission material layer between the anode electrode and the cathode electrode,
   an extension part extended from the anode electrode;
   an extension line extending in a first direction; and
   a passivation layer on the extension line,
   wherein the extension line comprises first extension line and second extension line, and
   wherein the first extension line and second extension line are branched off from the one end of the extension line.

20. The display device of claim 19,
   wherein the extension part includes a first extension part and a second extension part,
   wherein the first extension line overlaps with the first extension part, and
   wherein the second extension line overlaps with the second extension part.

21. The display device of claim 19,
   wherein the first extension line and the second extension line have a shape bent at a right angle.

22. The display device of claim 19, further comprises:
   an exposed part continuously and contiguously connected to one of the first and second extension lines, the exposed part not overlapping with the extension part of the anode electrode in a vertical direction and a horizontal direction.

* * * * *